United States Patent
Liao

(10) Patent No.: US 10,446,556 B2
(45) Date of Patent: Oct. 15, 2019

(54) METHOD FOR PREPARING A SEMICONDUCTOR MEMORY STRUCTURE

(71) Applicant: NANYA TECHNOLOGY CORPORATION, New Taipei (TW)

(72) Inventor: Wei-Ming Liao, Taoyuan (TW)

(73) Assignee: NANYA TECHNOLOGY CORPORATION, New Taipei (TW)

( * ) Notice: Subject to any disclaimer, the term of this patent is extended or adjusted under 35 U.S.C. 154(b) by 0 days.

(21) Appl. No.: 16/184,636

(22) Filed: Nov. 8, 2018

(65) Prior Publication Data

US 2019/0198505 A1 Jun. 27, 2019

Related U.S. Application Data

(62) Division of application No. 15/867,043, filed on Jan. 10, 2018.

(60) Provisional application No. 62/610,264, filed on Dec. 25, 2017.

(51) Int. Cl.
*H01L 27/108* (2006.01)
*G11C 11/401* (2006.01)

(52) U.S. Cl.
CPC ...... *H01L 27/10838* (2013.01); *G11C 11/401* (2013.01); *H01L 27/1087* (2013.01); *H01L 27/10882* (2013.01)

(58) Field of Classification Search
CPC ........... H01L 27/10838; H01L 27/1087; H01L 27/10882; G11C 11/401
USPC .................................. 257/301; 438/243, 386
See application file for complete search history.

(56) References Cited

U.S. PATENT DOCUMENTS

2013/0119448 A1* 5/2013 Lee .................. H01L 27/10823
257/296
2013/0320442 A1* 12/2013 Liao .................. H01L 27/10876
257/334

FOREIGN PATENT DOCUMENTS

TW 201735020 A 10/2017

OTHER PUBLICATIONS

An Office Action in corresponding TW Application No. 107108169 dated Mar. 28, 2019 is attached, 5 pages.

* cited by examiner

*Primary Examiner* — Didarul A Mazumder
(74) *Attorney, Agent, or Firm* — Muncy, Geissler, Olds & Lowe, PC

(57) ABSTRACT

The present disclosure provides a method for preparing a semiconductor memory structure. The method includes the following steps: providing a substrate comprising a plurality of active regions extending in a first direction; forming a plurality of first trenches in the substrate, the first trenches comprising a first depth and extending in a second direction different from the first direction; forming a plurality of buried digit lines in the first trenches; forming a plurality of second trenches in the substrate, the second trenches comprising a second depth and extending in a third direction different from the first direction and the second direction; deepening portions of the second trenches to form a plurality of third trenches in the substrate, the third trenches comprising a third depth; and forming a plurality of buried word lines in the third trenches.

7 Claims, 28 Drawing Sheets

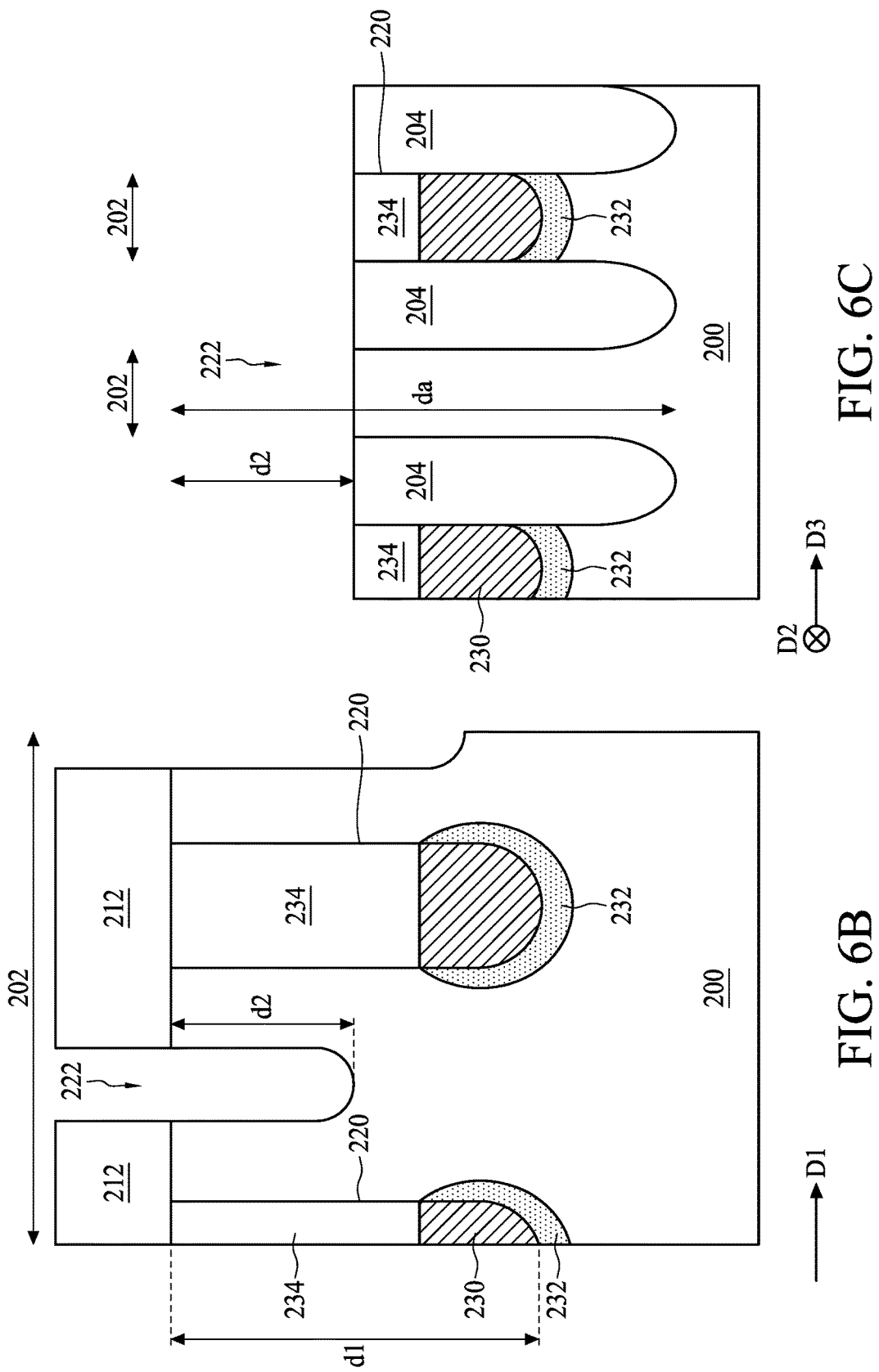

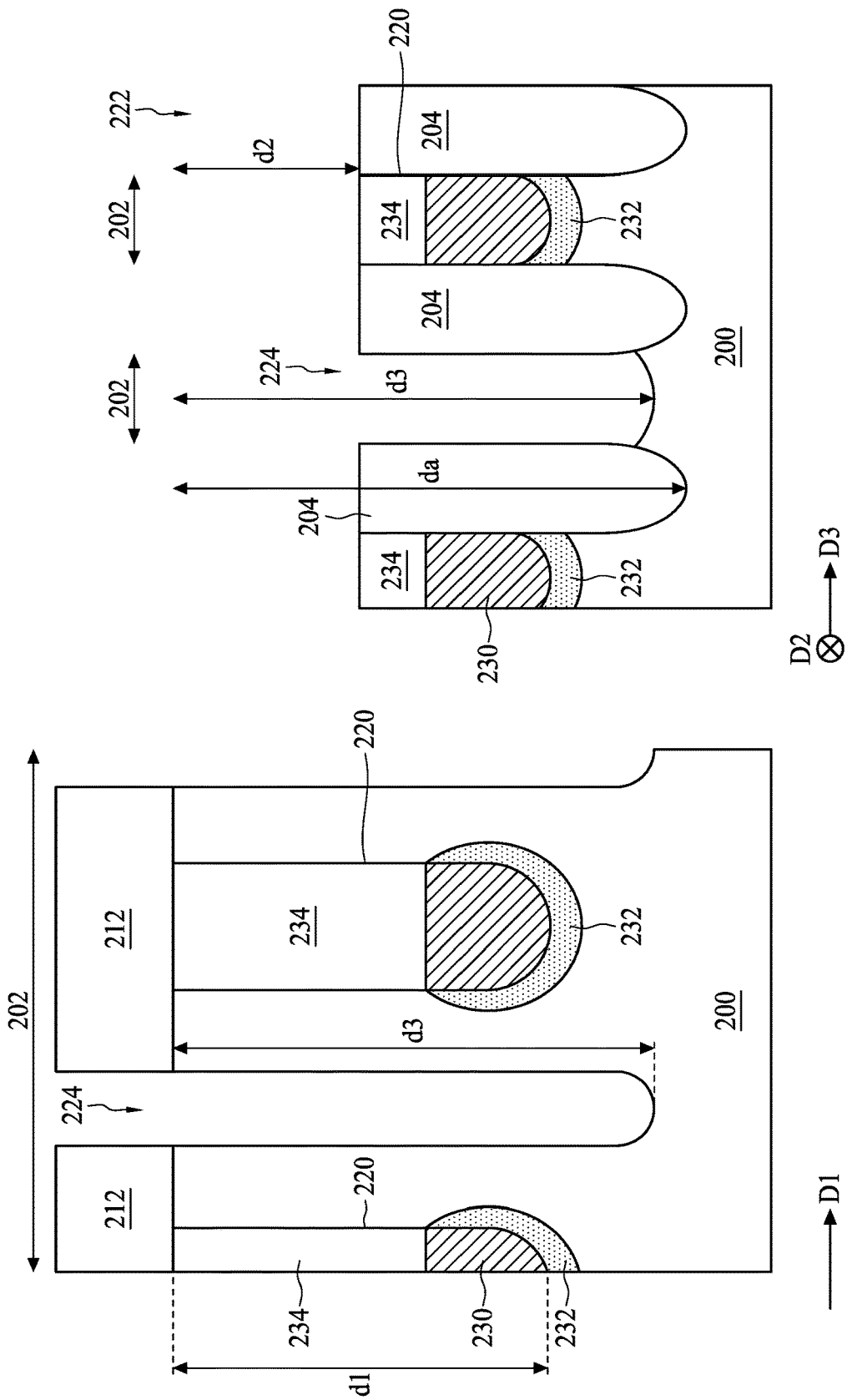

METHOD FOR PREPARING A SEMICONDUCTOR MEMORY STRUCTURE

PRIORITY CLAIM AND CROSS-REFERENCE

This application is a divisional application of U.S. application Ser. No. 15/867,043, filed on Jan. 10, 2018, which claims the benefit of U.S. Provisional Patent Application Ser. No. 62/610,264 filed on Dec. 25, 2017. The entireties of the above-mentioned patent applications are hereby incorporated by reference herein and made a part of this specification.

TECHNICAL FIELD

The present disclosure relates to a semiconductor memory structure and a method for preparing the same, and more particularly, to a semiconductor dynamic random access memory (DRAM) structure and a method for preparing the same.

DISCUSSION OF THE BACKGROUND

Electrical products are becoming lighter, thinner, shorter, and smaller, and DRAMs are being scaled down to match the trends of high integration and high density. A DRAM including many memory cells is one of the most popular volatile memory devices utilized today. Each memory cell includes a transistor and at least a capacitor, wherein the transistor and the capacitor form a series connection with each other. The memory cells are arranged into memory arrays. The memory cells are addressed via a word line and a digit line (or bit line), one of which addresses a column of memory cells while the other addresses a row of memory cells. By using the word line and the digit line, a DRAM cell can be read and programmed.

Recently, there has been increasing research on the buried word line cell array transistor, in which a word line is buried in a semiconductor substrate below the top surface of the substrate using a metal as a gate conductor. However, as the reduction of the device size also reduces the distance between the word lines and the bit lines, word line disturbance is observed in adjacent word lines. When the word line disturbance becomes serious, performance of the DRAM cell is degraded.

This Discussion of the Background section is for background information only. The statements in this Discussion of the Background are not an admission that the subject matter disclosed in this section constitutes a prior art to the present disclosure, and no part of this section may be used as an admission that any part of this application, including this Discussion of the Background section, constitutes prior art to the present disclosure.

SUMMARY

One aspect of the present disclosure provides a semiconductor memory structure. The semiconductor memory structure includes a substrate, a plurality of first trenches disposed in the substrate, a plurality of second trenches disposed in the substrate and spaced apart from the first trenches, a plurality of buried digit lines disposed in the first trenches, and a plurality of buried word lines disposed in the second trenches. The first trenches include a first depth, and the second trenches include a second depth. In some embodiments, the second depth of the second trenches is greater than the first depth of the first trenches. In some embodiments, top surfaces of the buried word lines are lower than bottom surfaces of the buried digit lines.

In some embodiments, the first trenches and the second trenches are alternately arranged.

In some embodiments, the semiconductor memory structure further includes a plurality of first isolation structures disposed individually on the buried digit lines in the first trenches.

In some embodiments, the semiconductor memory structure further includes a plurality of second isolation structures disposed in the second trenches. In some embodiments, the buried word lines are spaced apart from the substrate by the second isolation structures.

In some embodiments, the semiconductor memory structure further includes a plurality of first doped regions disposed individually in the substrate under the first trenches.

In some embodiments, each of the first doped regions surrounds a sidewall and a bottom of a buried digit line.

In some embodiments, the semiconductor memory structure further includes a plurality of second doped regions disposed in the substrate between the first trenches and the second trenches.

In some embodiments, the semiconductor memory structure further includes a plurality of capacitors individually electrically connected to the second doped regions.

In some embodiments, each of the buried word lines includes a curved surface curving toward the first trenches.

In some embodiments, the semiconductor memory structure further includes a plurality of third isolation structures disposed in the substrate, wherein the third isolation structures include a third depth.

In some embodiments, the first depth of the first trenches and the second depth of the second trenches are less than the third depth of the third isolation structures.

Another aspect of the present disclosure provides a method for preparing a semiconductor memory structure. The method includes the following steps. A substrate including a plurality of active regions extending in a first direction is provided. A plurality of first trenches is formed in the substrate. The first trenches include a first depth. In some embodiments, the first trenches extend in a second direction different from the first direction. A plurality of buried digit lines is formed in the first trenches. A plurality of second trenches is formed in the substrate. The second trenches include a second depth. In some embodiments, the second trenches extend in a third direction different from the first direction and the second direction. Portions of the second trenches are deepened to form a plurality of third trenches in the substrate. The third trenches include a third depth. A plurality of buried word lines are formed in the third trenches.

In some embodiments, the substrate further includes a plurality of first isolation structures. In some embodiments, the active regions are electrically isolated and spaced apart from each other by the first isolation structures.

In some embodiments, the first depth of the first trenches, the second depth of the second trenches, and the third depth of the third trenches are less than a depth of the first isolation structures.

In some embodiments, the third depth of the third trenches is greater than the first depth of the first trenches. In some embodiments, the first depth of the first trenches is greater than the second depth of the second trenches.

In some embodiments, the forming the buried digit lines further includes the following steps. A plurality of first doped regions are formed individually in the substrate under the first trenches. The buried digit lines are formed in the first trenches. In some embodiments, top surfaces of the buried digit lines are lower than openings of the first trenches. A plurality of second isolation structures are formed on the buried digit lines in the first trenches and fill the first trenches.

In some embodiments, the forming the buried word lines further includes the following steps. A plurality of first insulating layers are formed individually in the third trenches. In some embodiments, top surfaces of the first insulating layer are lower than openings of the third trenches and higher than the top surfaces of the buried digit lines. The buried word lines are formed on the first insulating layers in the third trenches. In some embodiments, top surfaces of the buried word lines are lower than the openings of the third trenches. A plurality of second insulating layers are formed on the buried word lines in the third trenches and fill the third trenches.

In some embodiments, the method further includes the following steps. A plurality of protecting spacers are formed on the first insulating layers in the third trenches. A portion of the first insulating layers and a portion of the substrate are removed to form a plurality of curved recesses in the first trenches. The buried word lines are formed in the curved recesses in the first trenches.

In some embodiments, the method further includes the following step. A plurality of second doped regions are formed in the active regions between the first trenches and the third trenches.

In some embodiments, the method further includes the following step. A plurality of capacitors electrically connected to the second doped regions are formed on the substrate.

In the present disclosure, a method for preparing the semiconductor memory structure is provided. Using the two etching processes, adjacent pairs of buried digit lines are spaced apart from each other by the isolation structures. By forming the buried word lines having the bottom surfaces higher than the top surfaces of the buried digit lines, adjacent pairs of buried word lines are spaced apart from each other by the isolation structures over the buried digit lines. Consequently, both word line to word line capacitance and digit line to digit line capacitance are reduced. Further, a semiconductor memory structure including a plurality of buried word lines and a plurality of buried digit lines are provided. Since both of the word lines and digit lines are buried in the substrate, the semiconductor memory structure provides vertical structures, which help to increase device density. Further, the buried word lines and the buried digit lines are alternately arranged. Since pairs of buried word lines are spaced apart from each other by the isolation structures, channel regions are also spaced apart from each other by those isolation structures, and thus word line disturbance is further reduced.

In contrast, with a comparative DRAM memory structure, pairs of word lines that share one digit line also share the same channel region, and thus always suffer from word line disturbance.

The foregoing has outlined rather broadly the features and technical advantages of the present disclosure in order that the detailed description of the disclosure that follows may be better understood. Additional features and technical advantages of the disclosure are described hereinafter, and form the subject of the claims of the disclosure. It should be appreciated by those skilled in the art that the concepts and specific embodiments disclosed may be utilized as a basis for modifying or designing other structures, or processes, for carrying out the purposes of the present disclosure. It should also be realized by those skilled in the art that such equivalent constructions do not depart from the spirit or scope of the disclosure as set forth in the appended claims.

BRIEF DESCRIPTION OF THE DRAWINGS

A more complete understanding of the present disclosure may be derived by referring to the detailed description and claims. The disclosure should also be understood to be connected to the figures' reference numbers, which refer to similar elements throughout the description, and:

FIGS. 2B, 3B, 4B, 5B, 6B, 7B, 8B, 9B, 10B, and 11B are cross-sectional views taken along line I-I' of FIGS. 2A, 3A, 4A, 5A, 6A, 7A, 8A, 9A, 10A, and 11A, respectively.

FIGS. 2C, 3C, 4C, 5C, 6C, 7C, 8C, 9C, and 10C are cross-sectional views taken along line II-II' of FIGS. 2A, 3A, 4A, 5A, 6A, 7A, 8A, 9A, and 10A, respectively.

DETAILED DESCRIPTION

Figure 1:
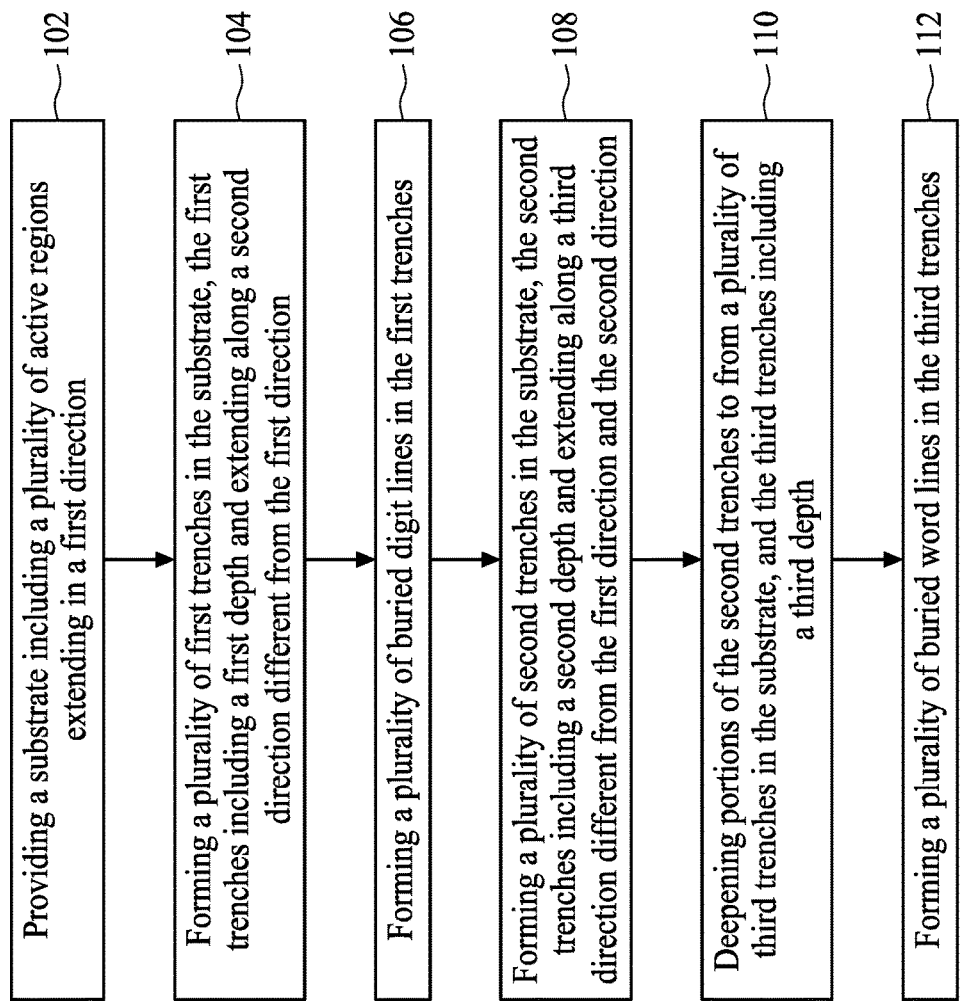
FIG. 1 is a flow diagram illustrating a method for preparing a semiconductor memory structure in accordance with some embodiments of the present disclosure.

Embodiments, or examples, of the disclosure illustrated in the drawings are now described using specific language. It shall be understood that no limitation of the scope of the disclosure is hereby intended. Any alteration or modification of the described embodiments, and any further applications of principles described in this document, are to be considered as normally occurring to one of ordinary skill in the art to which the disclosure relates. Reference numerals may be repeated throughout the embodiments, but this does not necessarily mean that feature(s) of one embodiment apply to another embodiment, even if they share the same reference numeral.

It shall be understood that, although the terms first, second, third, etc. may be used herein to describe various elements, components, regions, layers or sections, these elements, components, regions, layers or sections are not limited by these terms. Rather, these terms are merely used to distinguish one element, component, region, layer or section from another region, layer or section. Thus, a first element, component, region, layer or section discussed below could be termed a second element, component, region, layer or section without departing from the teachings of the present inventive concept.

The terminology used herein is for the purpose of describing particular example embodiments only and is not intended to be limited to the present inventive concept. As used herein, the singular forms "a," "an" and "the" are intended to include the plural forms as well, unless the context clearly indicates otherwise. It shall be further understood that the terms "comprises" and "comprising," when used in this specification, point out the presence of stated features, integers, steps, operations, elements, or components, but do not preclude the presence or addition of one or more other features, integers, steps, operations, elements, components, or groups thereof.

As used herein, the terms "patterning" and "patterned" are used in the present disclosure to describe an operation of forming a predetermined pattern on a surface. The patterning operation includes various steps and processes and varies in accordance with different embodiments. In some embodiments, a patterning process is adopted to pattern an existing film or layer. The patterning process includes forming a mask on the existing film or layer and removing the unmasked film or layer with an etch or other removal process. The mask can be a photoresist, or a hard mask. In some embodiments, a patterning process is adopted to form a patterned layer directly on a surface. The patterning process includes forming a photosensitive film on the surface, conducting a photolithography process, and performing a developing process. The remaining photosensitive film is retained and integrated into the semiconductor device.

FIG. 1 is a flow diagram illustrating a method for preparing a semiconductor memory structure 10 in accordance with some embodiments of the present disclosure. The method for preparing the semiconductor memory structure 10 includes a step 102: Providing a substrate including a plurality of active regions extending in a first direction. The method for preparing the semiconductor memory structure 10 further includes a step 104: forming a plurality of first trenches in the substrate. The first trenches include a first depth. In some embodiments, the first trenches extend in a second direction different from the first direction. The method for preparing the semiconductor memory structure 10 further includes a step 106: forming a plurality of buried digit lines in the first trenches. The method for preparing the semiconductor memory structure 10 further includes a step 108: forming a plurality of second trenches in the substrate. The second trenches include a second depth. In some embodiments, the second trenches extend in a third direction different from the first direction and the second direction. The method for preparing the semiconductor memory structure 10 further includes a step 110: deepening portions of the second trenches to form a plurality of third trenches in the substrate. The third trenches include a third depth. The method for preparing the semiconductor memory structure 10 further includes a step 112: forming a plurality of buried word lines in the third trenches. The method for preparing the semiconductor memory structure 10 will be further described according to one or more embodiments.

Figure 2A:
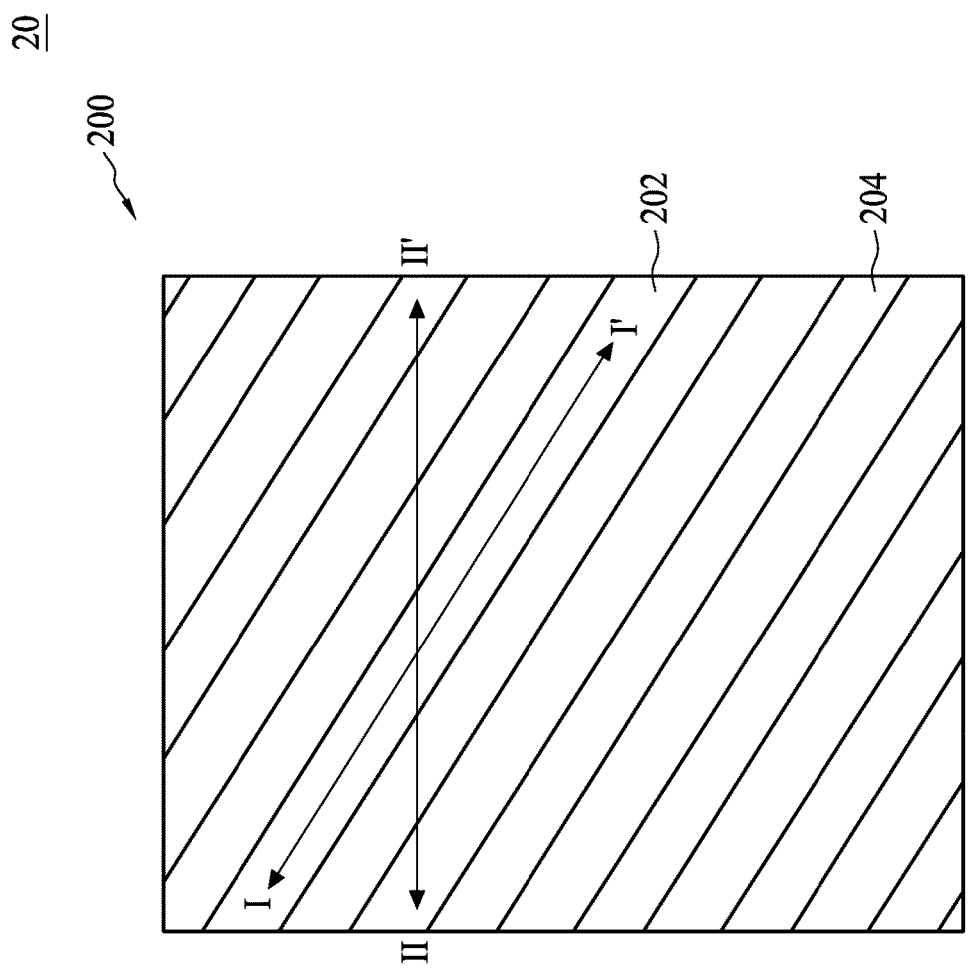
FIGS. 2A, 3A, 4A, 5A, 6A, 7A, 8A, 9A, 10A, and 11A are schematic diagrams illustrating various fabrication stages of the method for preparing the semiconductor memory structure in accordance with some embodiments of the present disclosure.
Figure 2C:
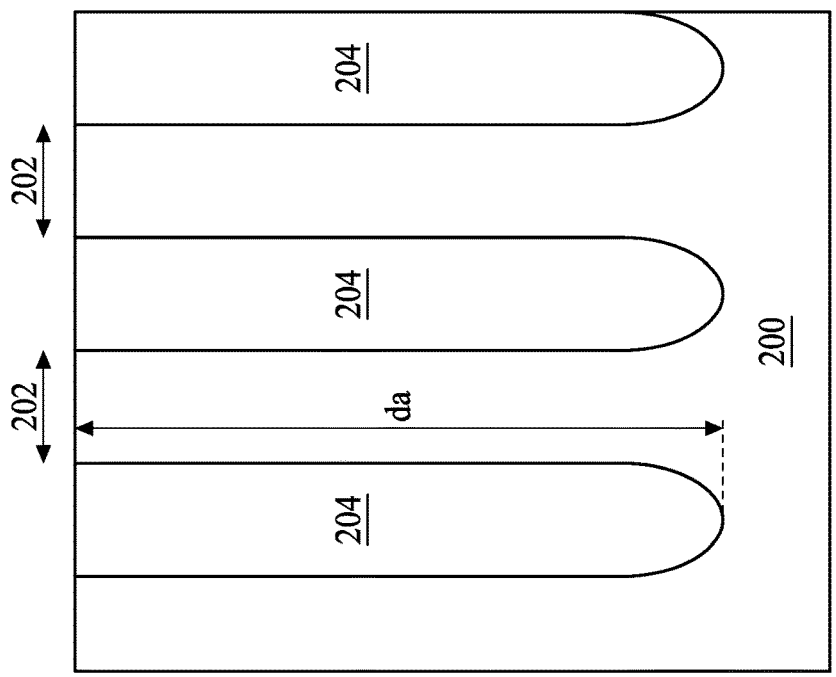
Figure 2B:
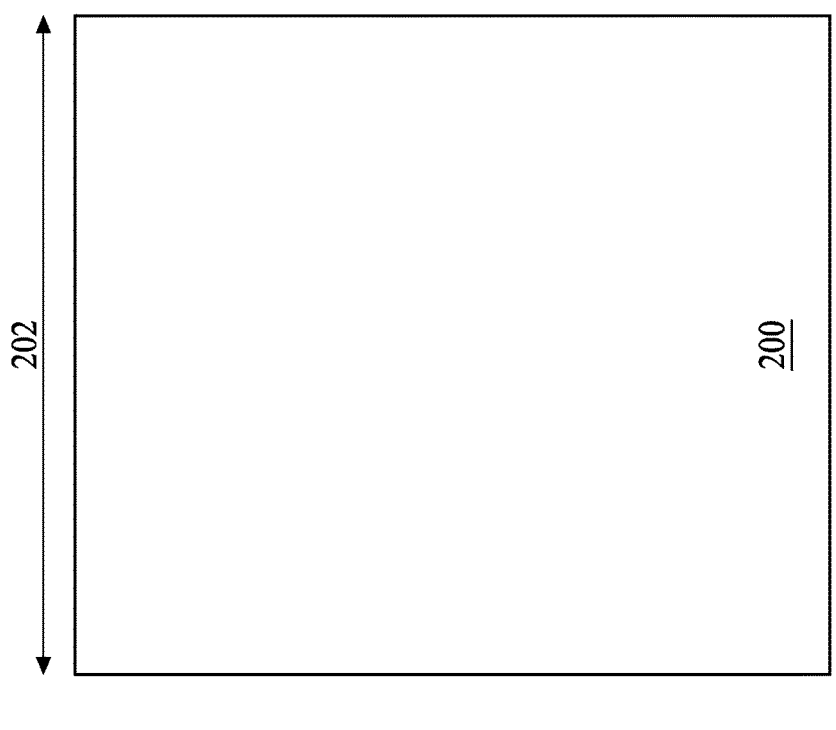

FIGS. 2A, 3A, 4A, 5A, 6A, 7A, 8A, 9A, 10A, and 11A are schematic diagrams illustrating various fabrication stages of the method for preparing the semiconductor memory structure in accordance with some embodiments of the present disclosure, FIGS. 2B, 3B, 4B, 5B, 6B, 7B, 8B, 9B, 10B, and 11B are cross-sectional views taken along line I-I' of FIGS. 2A, 3A, 4A, 5A, 6A, 7A, 8A, 9A, 10A, and 11A, respectively, and FIGS. 2C, 3C, 4C, 5C, 6C, 7C, 8C, 9C, and 10C are cross-sectional views taken along line II-II' of FIGS. 2A, 3A, 4A, 5A, 6A, 7A, 8A, 9A, and 10A, respectively. Referring to FIGS. 2A, 2B and 2C, a substrate 200 is provided according to step 102. In some embodiments, the substrate 200 includes a silicon (Si) substrate, a germanium (Ge) substrate, or a silicon-germanium (SiGe) substrate, but the disclosure is not limited thereto. The substrate 200 includes a plurality of active regions 202 extending a first direction D1. In some embodiments, the active regions 202 are electrically isolated and spaced apart from each other by a plurality of isolation structures 204. In some embodiments, the isolation structures 204 can be formed by shallow trench isolation (STI) technique, but the disclosure is not limited thereto. For example, a plurality of shallow trenches (not shown) can be formed in the substrate 200 in a striped arrangement, and insulating material such as silicon oxide (SiO), silicon nitride (SiN), and/or silicon oxynitride (SiON) is formed to fill the shallow trenches. The isolation structures 204 include a depth "da." In some embodiments, the depth da of the isolation structures 204 is between about 250 nanometers (nm) and about 350 nm, but the disclosure is not limited thereto. In some embodiments, an ion implantation can be selectively performed to implant boron (B) into an area of the substrate 200 exposed through the shallow trenches before filling the shallow trenches with the insulating material for further improving electrical isolation, but the disclosure is not limited thereto. In some embodiments, an ion implantation for the well region can be performed after forming the isolation structures 204.

Figure 3A:
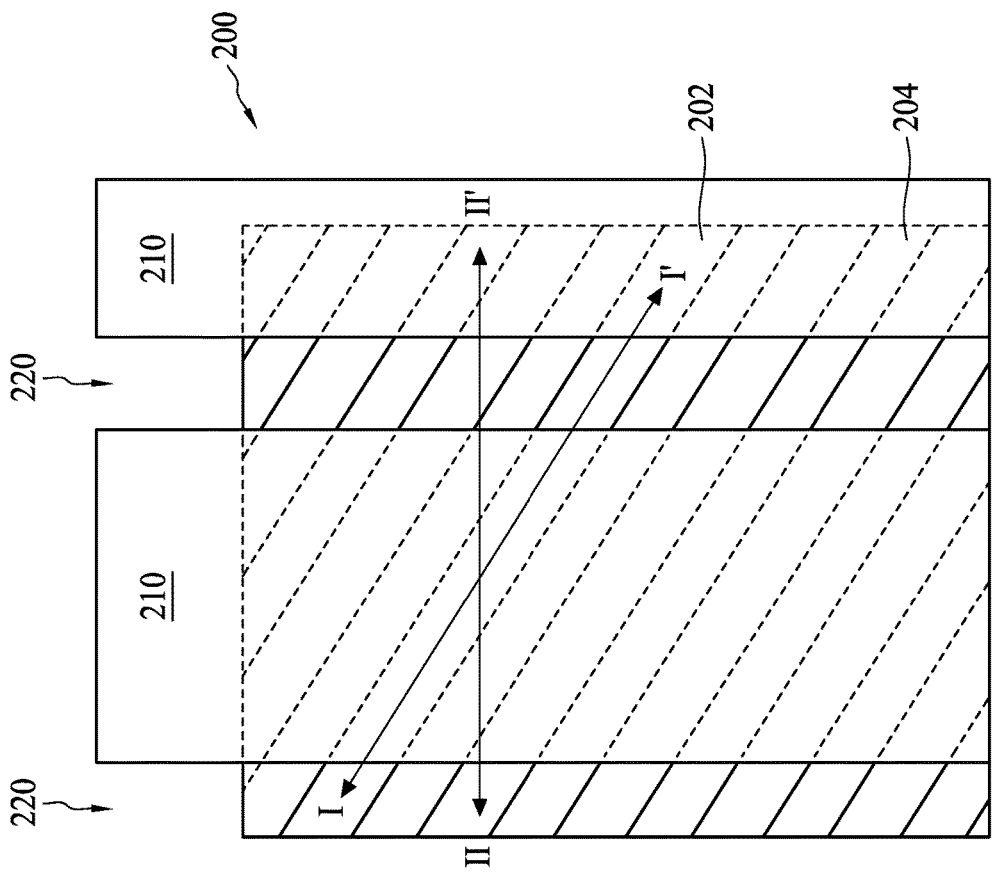
Figure 3C:
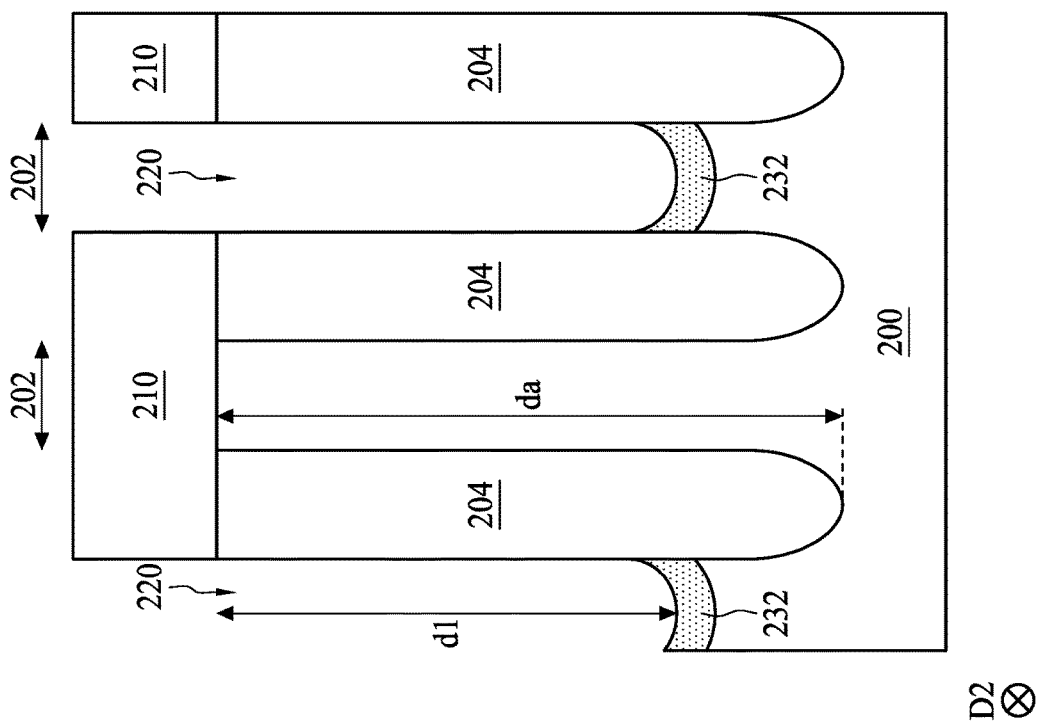
Figure 3B:
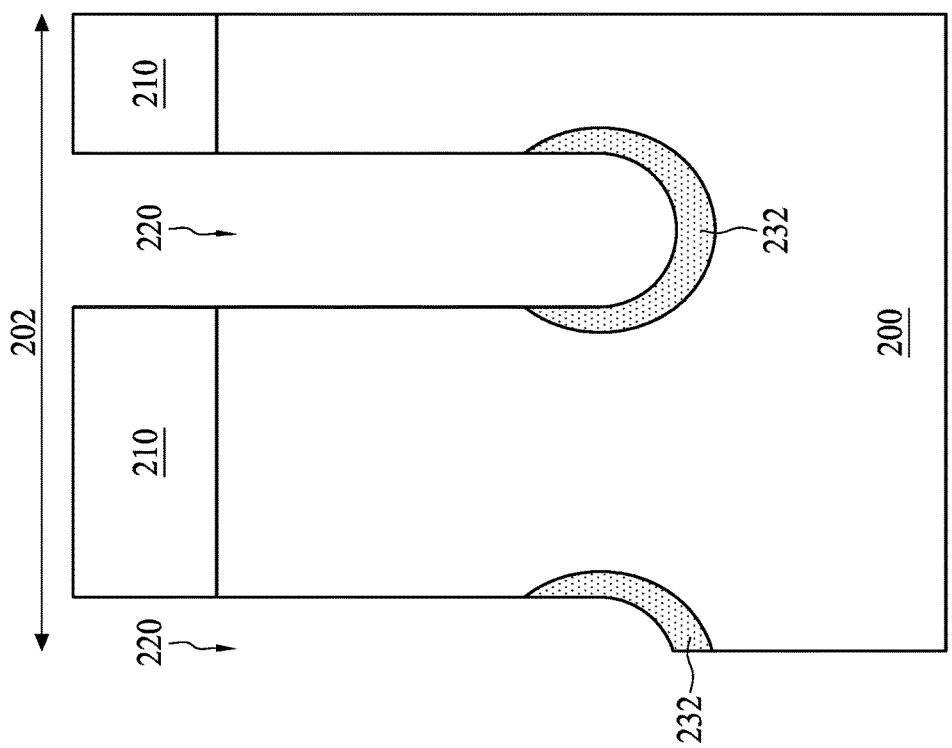

Referring to FIGS. 3A, 3B and 3C, next, a plurality of first trenches 220 are formed in the substrate 200 according to step 104. In some embodiments, a patterned mask 210 is formed on the substrate 200. In some embodiments, the patterned mask 210 includes a patterned hard mask layer and a patterned photoresist, but the disclosure is not limited thereto. A first etching process is performed to etch the substrate 200 with proper etchants. In some embodiments, portions of active regions 202 and portions of the isolation structures 204 are removed to form a plurality of first trenches 220 in the substrate 200. As shown in FIG. 3A, the first trenches 220 extend in a second direction D2, and the second direction D2 is different from the first direction D1 in a plane. The first trenches 220 include a depth d1. In some embodiments, the depth d1 of the first trenches 220 is less than the depth da of the isolation structures 204, as shown in FIG. 3C. In some embodiments, the depth d1 of the first trenches 220 can be between about 150 nm and about 200 nm, but the disclosure is not limited thereto.

Next, a plurality of buried digit lines 230 are formed in the first trenches 220 according to step 106. In some embodiments, the step 104 for forming the buried digit lines 230 further include the following steps. In some embodiments, an ion implantation is performed to form a plurality of first doped regions 232 in an area of the substrate 200 exposed through a bottom of the first trenches 220. As shown in FIGS. 3B and 3C, the first doped regions 210 are formed individually in the substrate 200 under the first trenches 220. In some embodiments, the first doped regions 222 are heavily doped with arsenic (As), but the disclosure is not limited thereto. The patterned hard mask 210 is removed after forming the first doped regions 232.

Figure 4A:
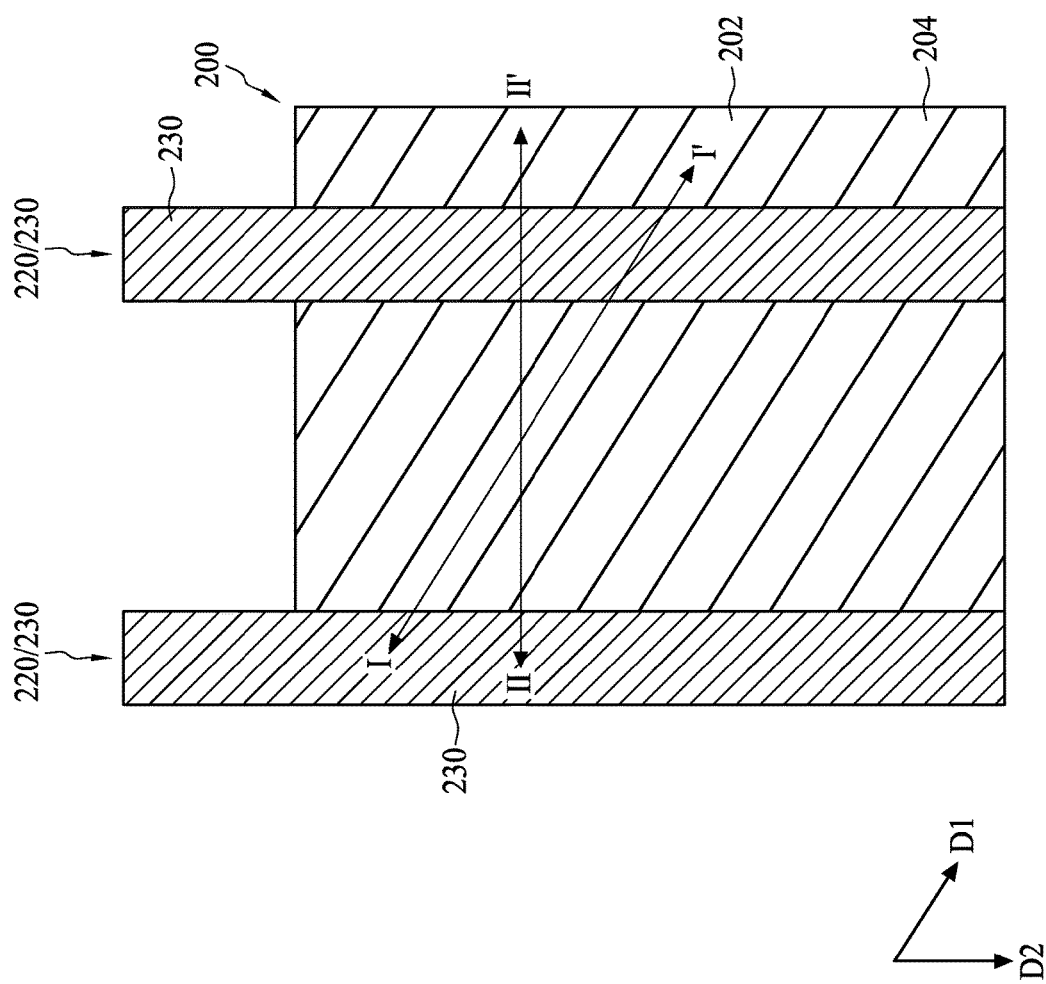
Figure 4C:
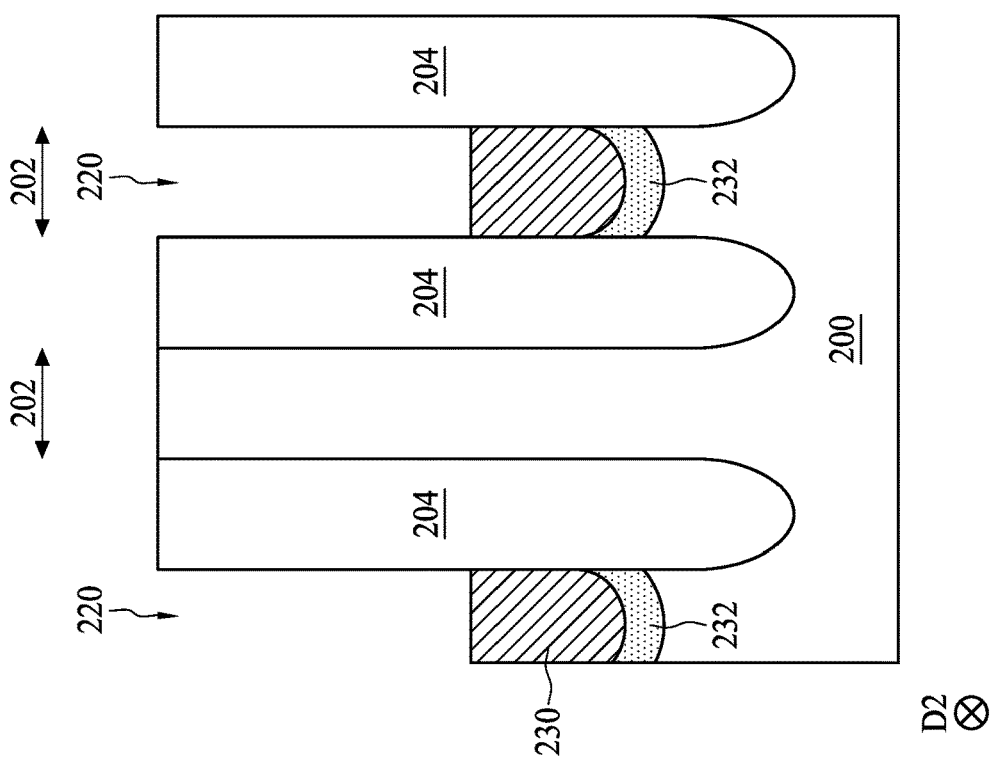
Figure 4B:
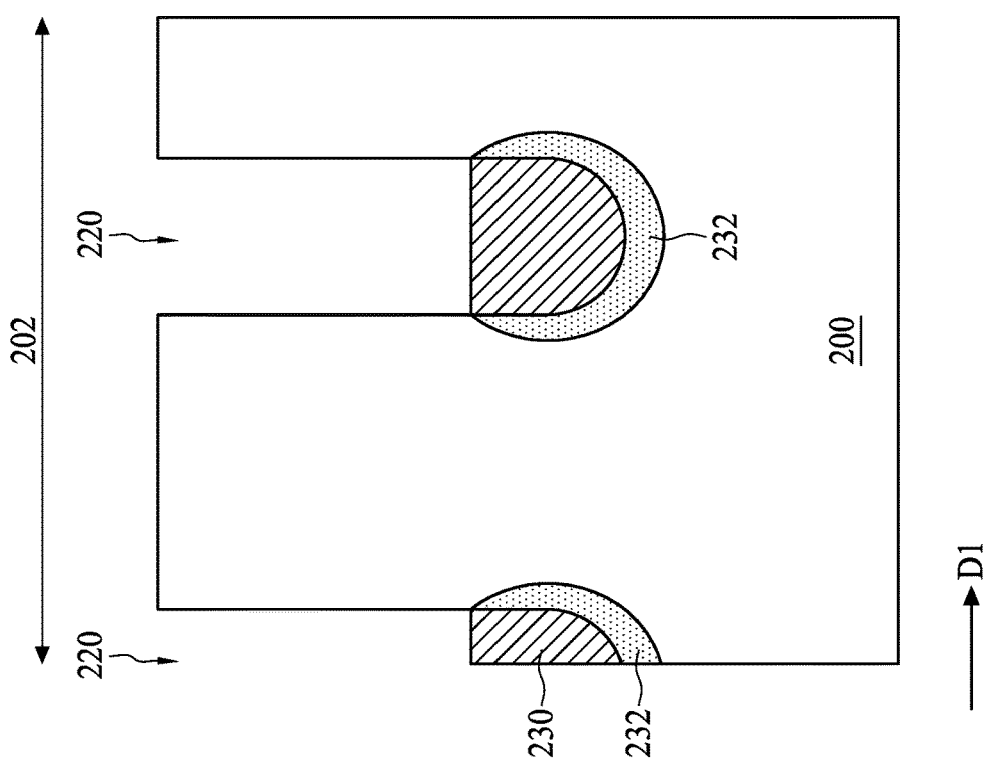

Referring to FIGS. 4A, 4B and 4C, next, a first conductive material is formed in the first trenches 220. Accordingly, the first conductive material may be formed of any one of the group consisting of titanium nitride (TiN), titanium/titanium nitride (Ti/TiN), tungsten nitride (WN), tungsten/tungsten nitride (W/WN), tantalum nitride (TaN), tantalum/tantalum nitride (Ta/TaN), titanium silicon nitride (TiSiN), tantalum silicon nitride (TaSiN), tungsten silicon nitride (WSiN), or a combination thereof. The first conductive material may be formed using a chemical vapor deposition (CVD) or an atomic layer deposition (ALD) method. After forming the first conductive material, an etching process may be performed to recess the first conductive material. Accordingly, the buried digit lines 230 are obtained. As shown in FIG. 4A, the buried digit lines 230 extend in the second direction D2. Accordingly, portions of the buried digit lines 230 are formed in the active regions 202, and portions of the buried digit lines 230 are formed in the isolation structures 204. As shown in FIGS. 4B and 4C, top surfaces of the buried digit lines 230 are lower than openings of the first trenches 204. Further, each first doped region 232 surrounds a sidewall and a bottom of a buried digit line 230.

Figure 5A:
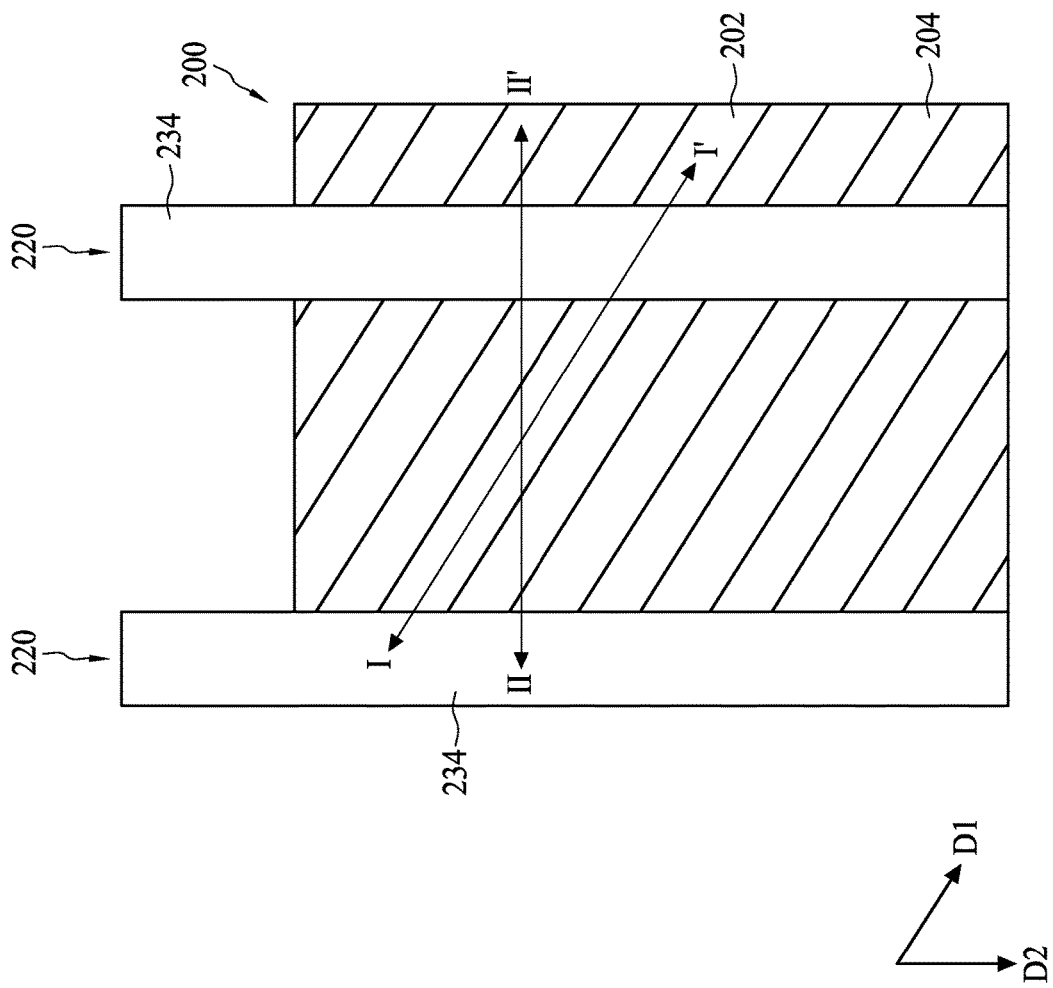
Figure 5C:
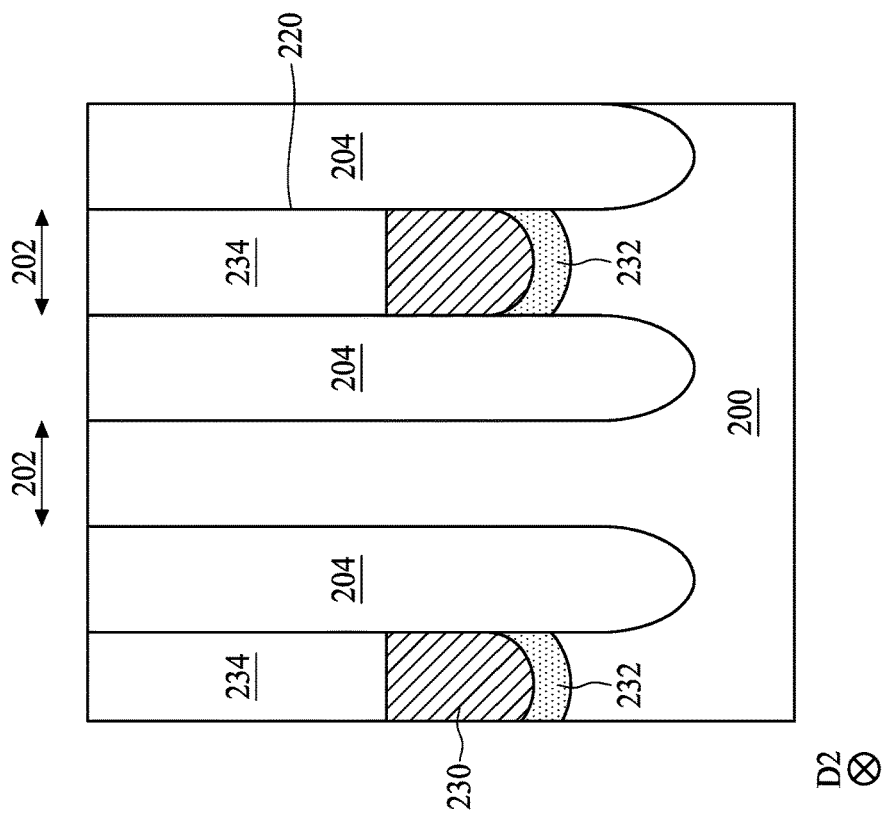
Figure 5B:
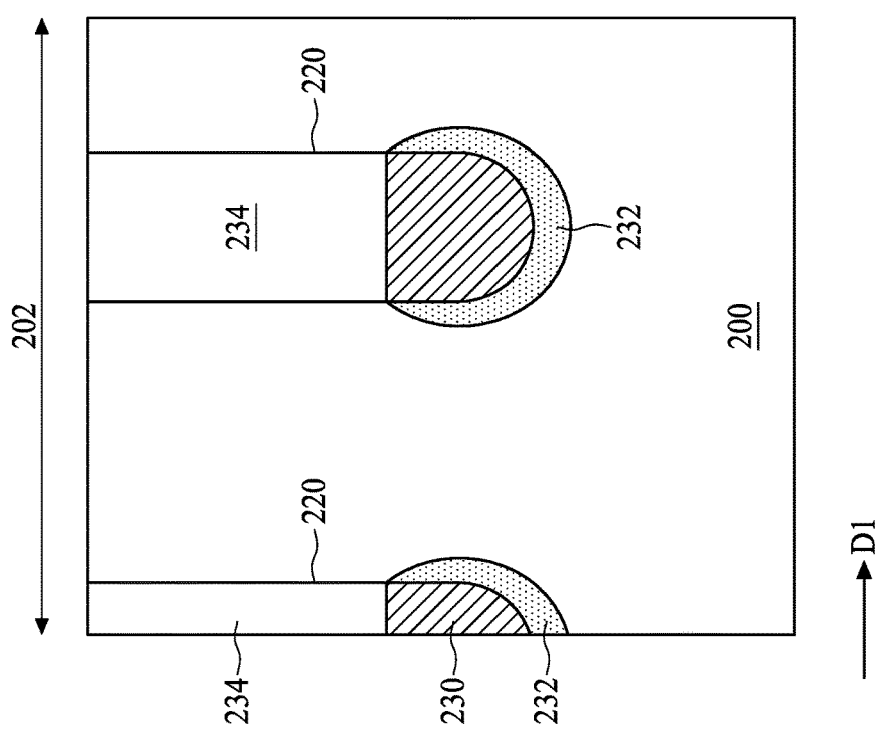

Referring to FIGS. 5A and 5B, after forming the buried digit lines 230, an insulating material is formed to fill the first trenches 220. A planarization process can be subsequently performed to remove superfluous insulating material from the substrate 200 and thus to form an isolation structure 234 on the buried digit line 230 in each first trench 220. Consequently, the buried digit lines 230 are covered by the isolation structures 234, and the top surfaces of the buried digit lines 230 are lower than the top surface of the substrate 200. In some embodiments, the isolation structures 234 can include insulating materials different from that used to form the isolation structures 204, but the disclosure is not limited thereto. Additionally, the isolation structures 234 extend in the second direction D2, as shown in FIG. 5A.

Figure 6A:
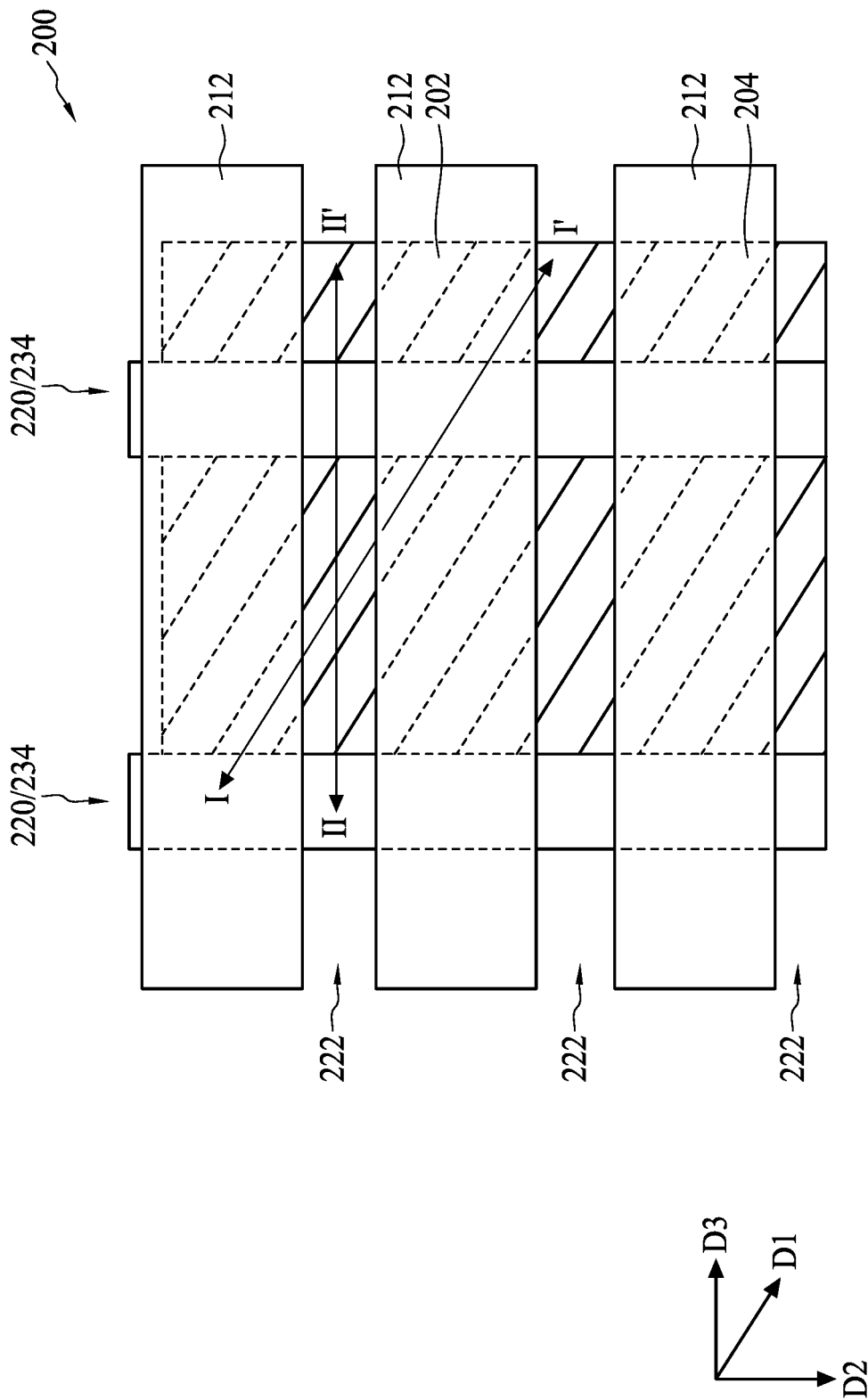

Referring to FIGS. 6A, 6B and 6C, next, a plurality of second trenches 222 are formed in the substrate 200 according to step 108. In some embodiments, a patterned mask 212 is formed on the substrate 200. In some embodiments, the patterned mask can include a patterned hard mask layer and a patterned photoresist, but the disclosure is not limited thereto. A second etching process is performed to etch the substrate 200 with proper etchants. In some embodiments, the second etching process is a low selectivity etching, such that portions of the active regions 202, portions of the isolation structures 204, and portions of the isolation structures 234 are removed to form a plurality of second trenches 222 in the substrate 200. As shown in FIG. 6A, the second trenches 222 extend in a third direction D3, and the third direction D3 is different from the first direction D1 and the second direction D2 in the plane. In some embodiments, the third direction D3 can be perpendicular to the second direction D2, but the disclosure is not limited thereto. The second trenches 222 include a depth d2. In some embodiments, the depth d2 of the second trenches 222 is less than the depth d1 of the first trenches 220 and the depth da of the isolation structures 204. In some embodiments, the depth d2 of the second trenches 222 can be less than 100 nm. In some embodiments, the depth d2 of the second trenches 222 can be less than 80 nm, but the disclosure is not limited thereto.

Figure 7A:
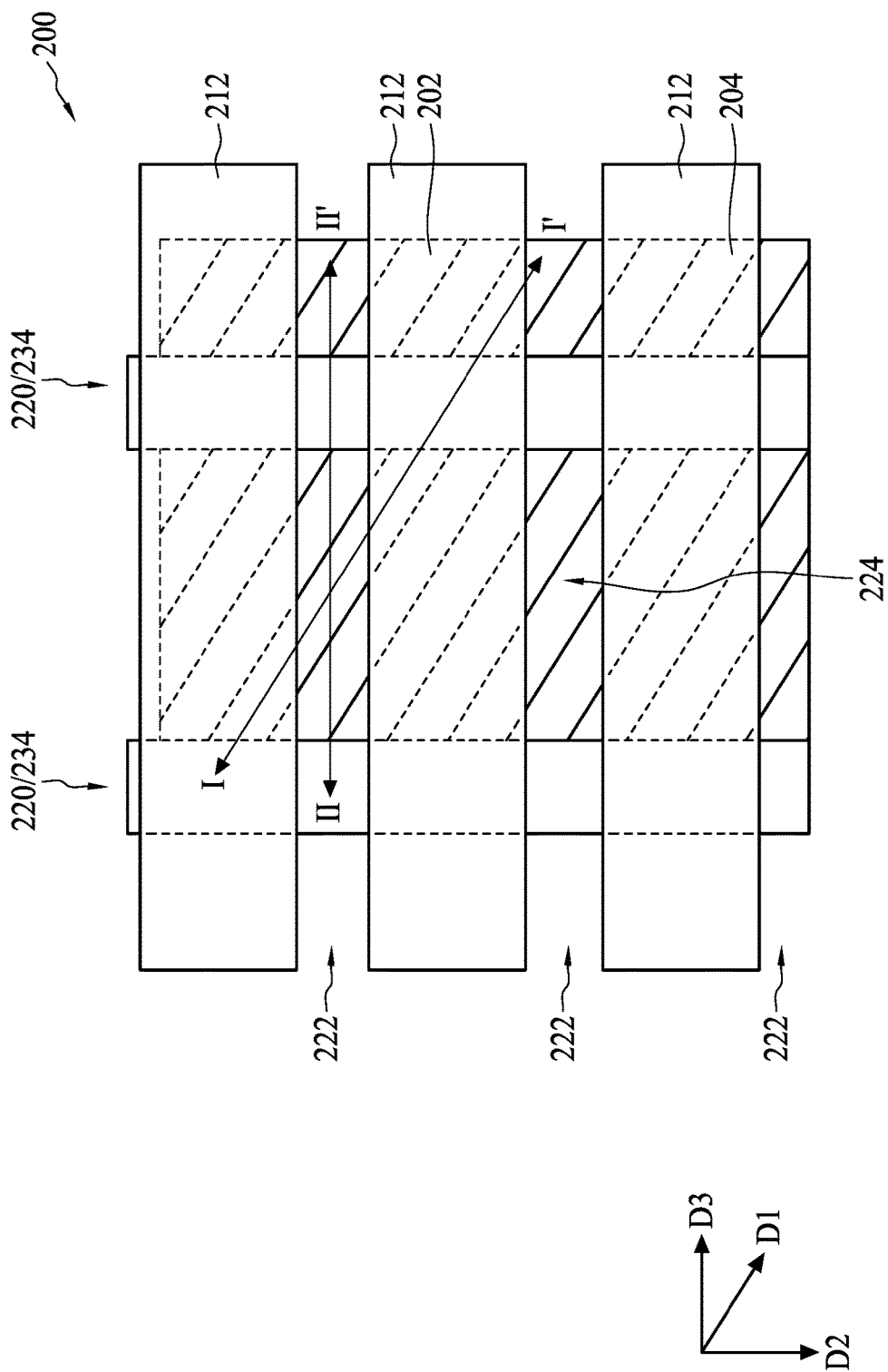

Referring to FIGS. 7A, 7B and 7C, next, portions of the second trenches 222 are removed to deepen the second trenches 222 and to form a plurality of third trenches 234 in the substrate 200 according to step 110. In some embodiments, the patterned mask 212 can be left remaining over the substrate 200 to serve as an etching mask, but the disclosure is not limited thereto. A third etching process is performed to etch the substrate 200 with proper etchants. In some embodiments, the third etching process is a high selectivity etching, such that portions of the substrate 200 in the active regions 202 are removed, while the isolation structures 204 and the isolation structures 234 are almost impervious, as shown in FIGS. 7B and 7C. Further, unlike the first trenches 212 and the second trenches 222, which are in a striped arrangement, the third trenches 224 are in an island arraignment, as shown in FIGS. 7B and 7C. In some embodiments, the island-like third trenches 224 are arranged along the third direction D3. The third trenches 224 include a depth d3. In some embodiments, the depth d3 of the third trenches 224 is a sum of the depth d2 of the second trenches 222 and a thickness of the substrate 200 being removed by the third etching process. In some embodiments, the depth d3 of the third trenches 224 is greater than the first depth d1 of the first trenches 220 as shown in FIG. 7B. In some embodiments, the depth d3 of the third trenches 224 is less than the depth da of the isolation structures 204. In some embodiments, the depth d3 of the third trenches 222 is between about 250 nm and about 300 nm, but the disclosure is not limited thereto. The patterned mask 212 is then removed from the substrate 200.

Figure 8A:
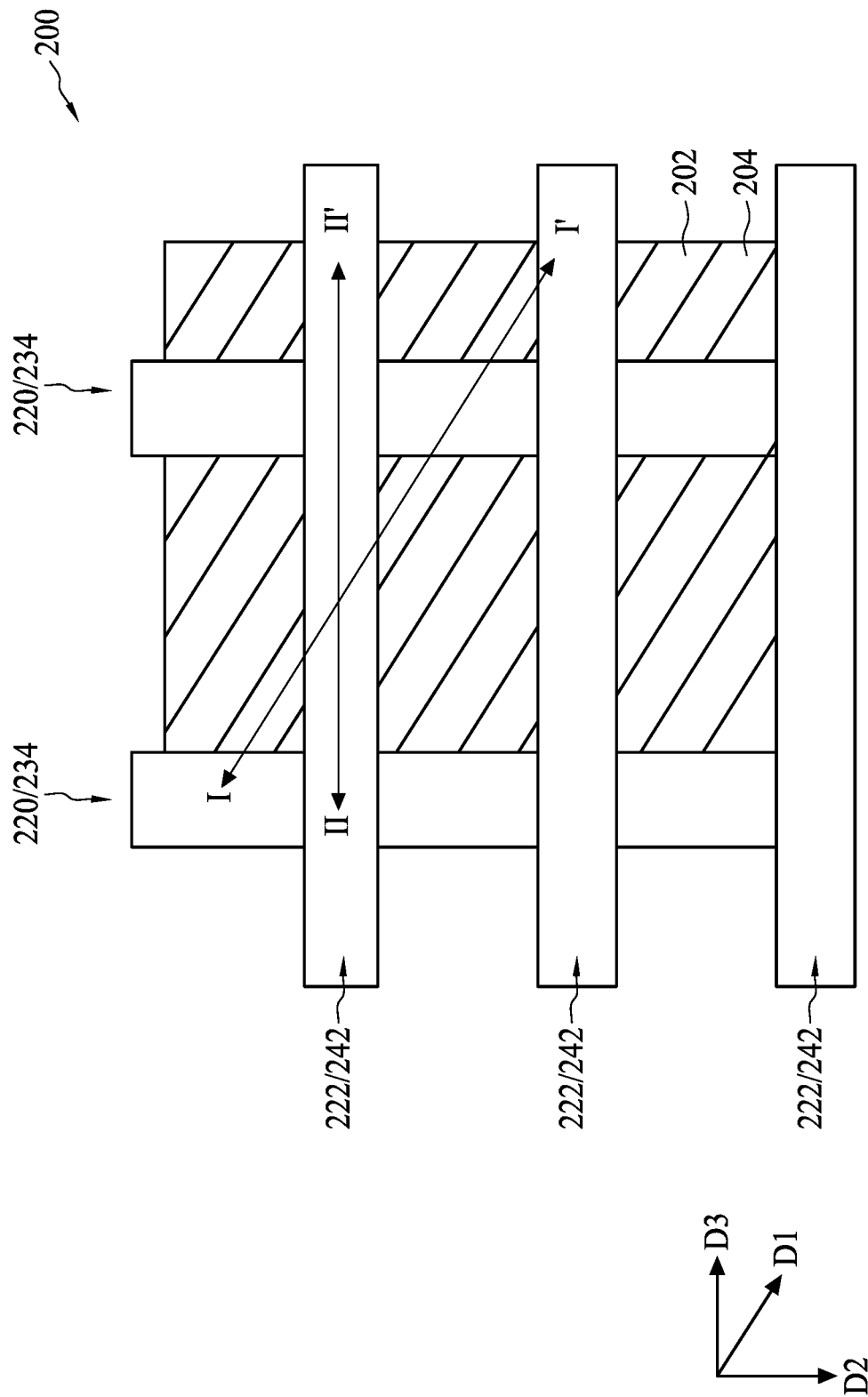
Figure 8C:
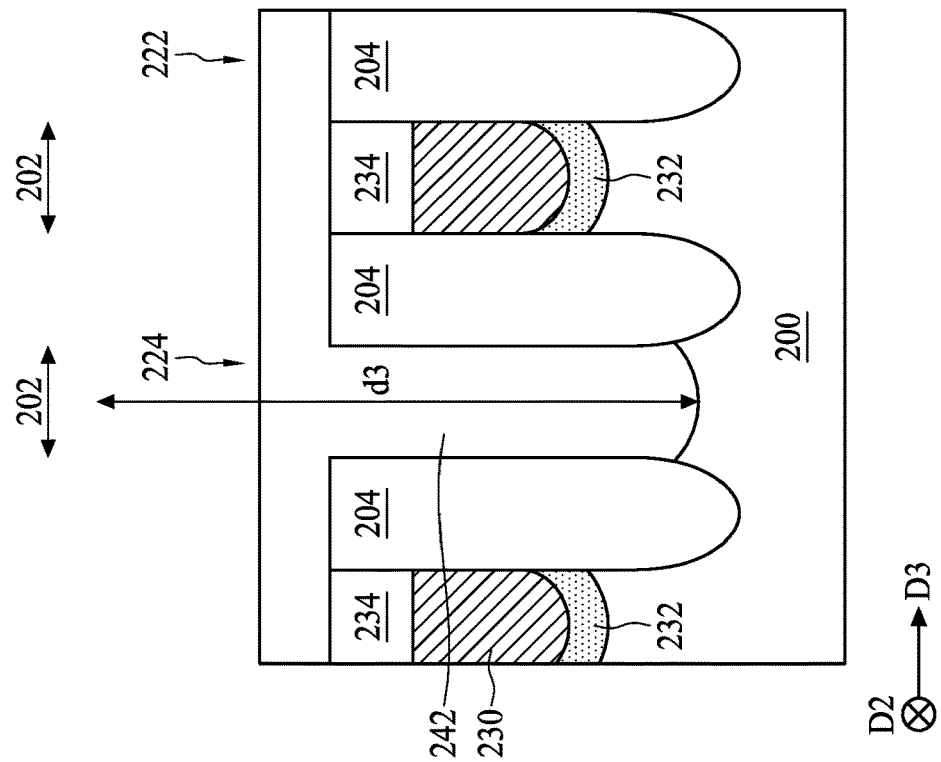
Figure 8B:
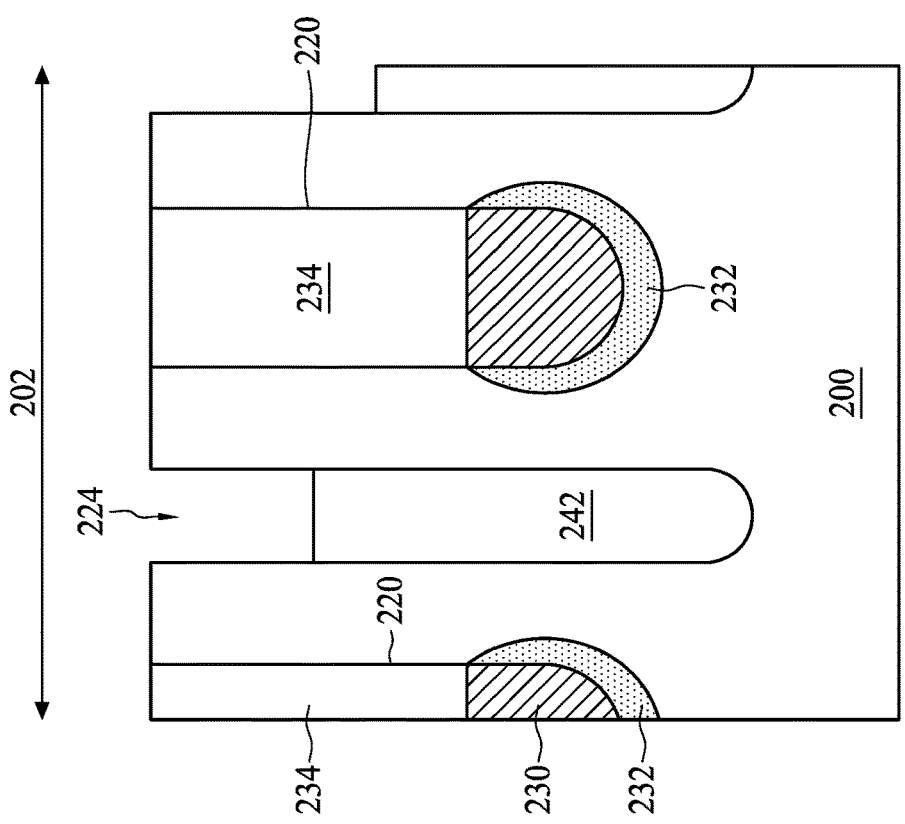

Referring to FIGS. 8A, 8B, and 8C, next, a plurality of buried word lines 240 are formed in the third trenches 224 according to step 112. In some embodiments, the formation of the buried word lines 240 further includes the following steps. In some embodiments, a first insulating material is formed in the third trenches 224. Further, an etching process, such as an etching back process, can be performed to remove portions of the first insulating material from the third trenches 224. Accordingly, a plurality of first insulating layers 242 are formed individually in the third trenches 224. Further, top surfaces of the first insulating layers 242 are lower than openings of the third trenches 224. However, the top surfaces of the first insulating layers 242 are higher than top surfaces of the buried digit lines 230, as shown in FIGS. 8B and 8C. In some embodiments, the first insulating layers 242 can include SiO, SiN, SiON, or high-k dielectric material, but the disclosure is not limited thereto.

Figure 9A:
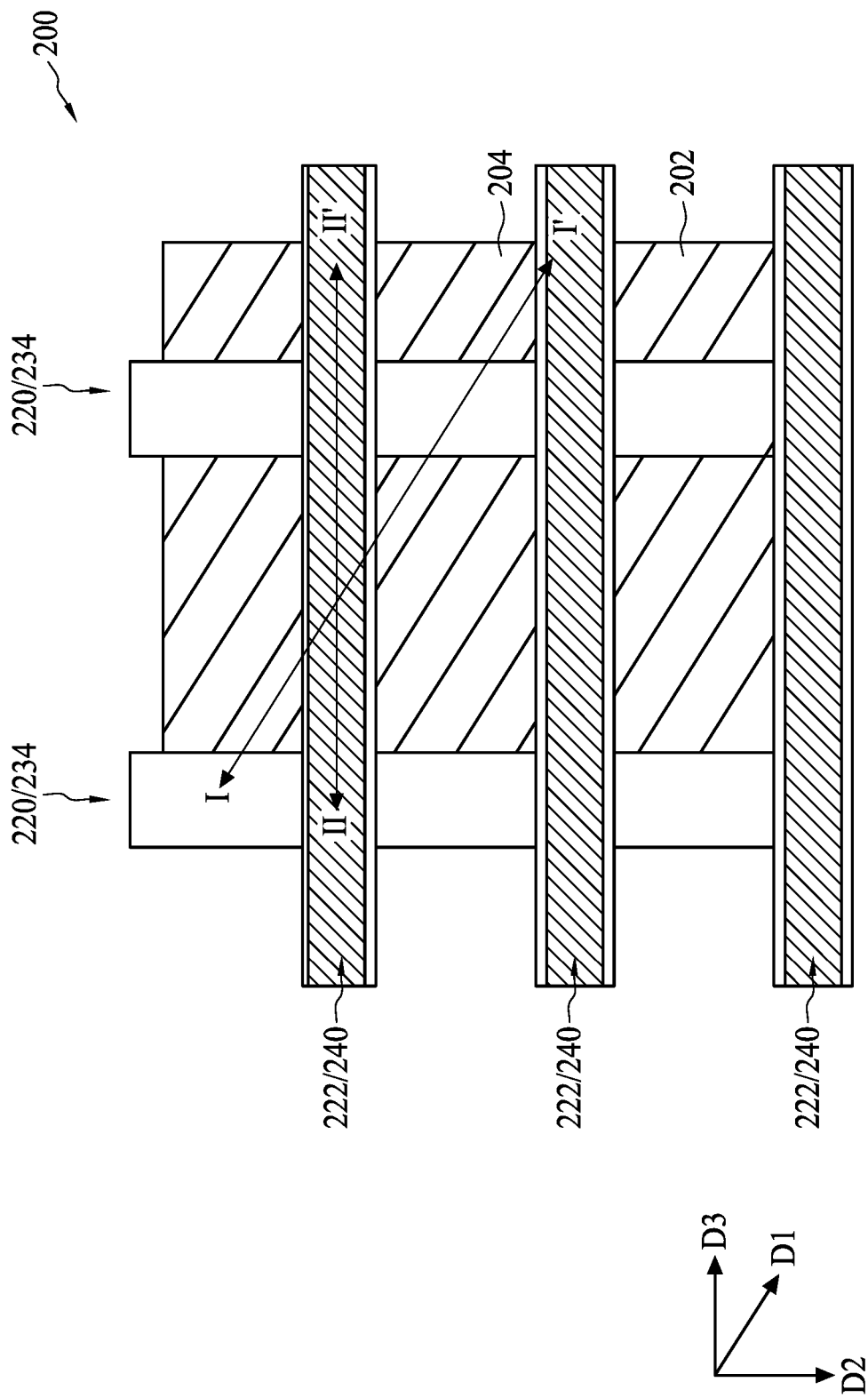
Figures 9B, 9C:
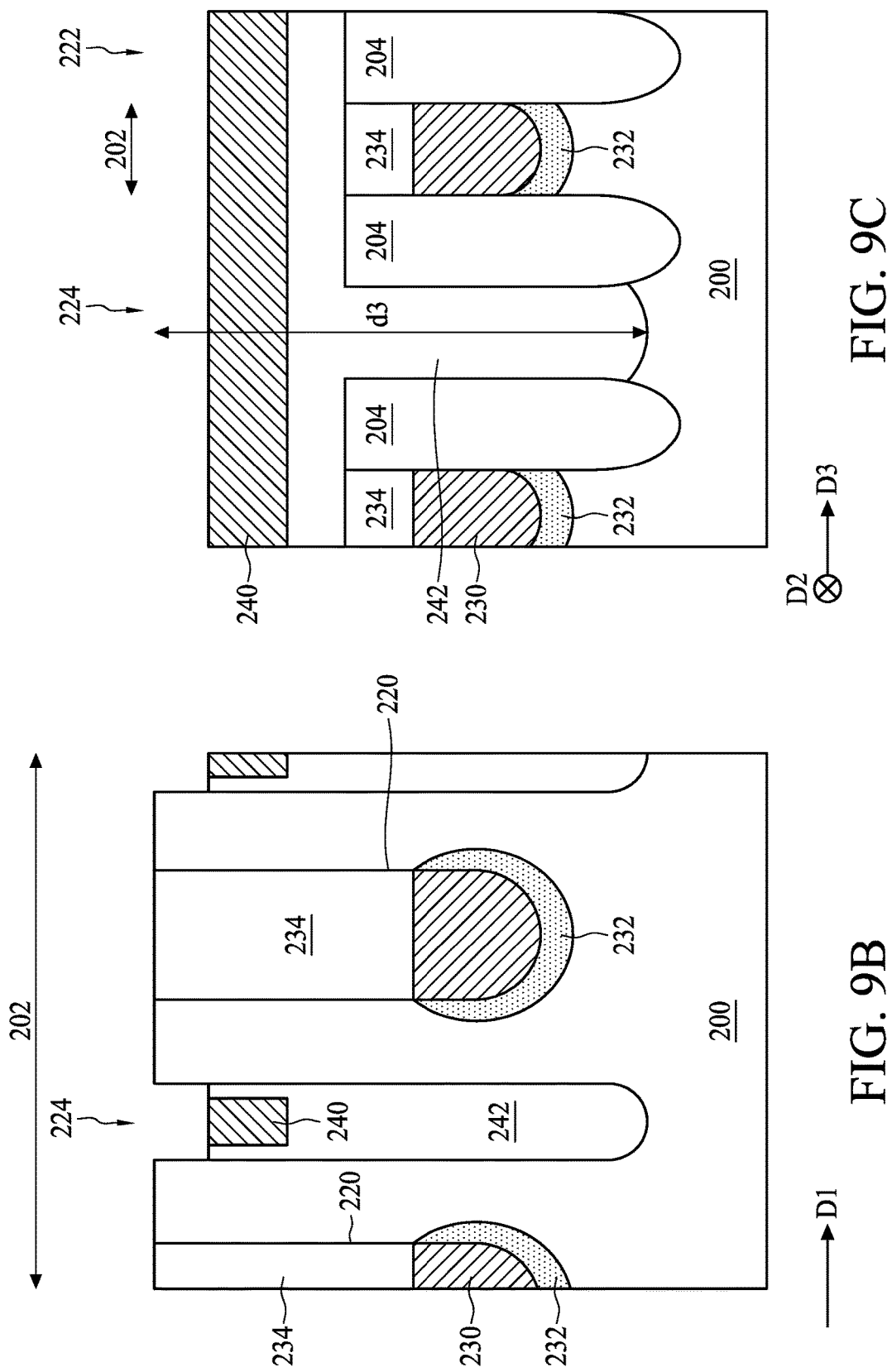

Referring to FIGS. 9A and 9B, next, a plurality of dielectric layers are formed to individually cover portions of the sidewalls of the third trenches 224. In some embodiments, the dielectric layers can include SiO, SiN, SiON, or high-k dielectric material, but the disclosure is not limited thereto. Next, a second conductive material is formed in the third trenches 224. In some embodiments, the second conductive material can be formed of any one of the group consisting of TiN, Ti/TiN, WN, W/WN, TaN, Ta/TaN, TiSiN, TaSiN, WSiN, and a combination thereof. The second conductive material may be formed using a CVD or an ALD method. After forming the second conductive material, an etching process may be performed to recess the second conductive material. Accordingly, the buried word lines 240 are formed individually on the first insulating layers 242 in the third trenches 224. In some embodiments, top surfaces of the buried word lines 240 are lower than the openings of the third trenches 224, but higher than the top surfaces of the buried digit lines 230. Further, bottom surfaces of the buried word lines 240 are higher than the top surfaces of the buried digit lines 230, as shown in FIGS. 9B and 9C. Additionally, the buried word lines 240 extend in the third direction D3. In other words, the buried word lines 240 are perpendicular to the buried digit lines 230.

Figure 10A:
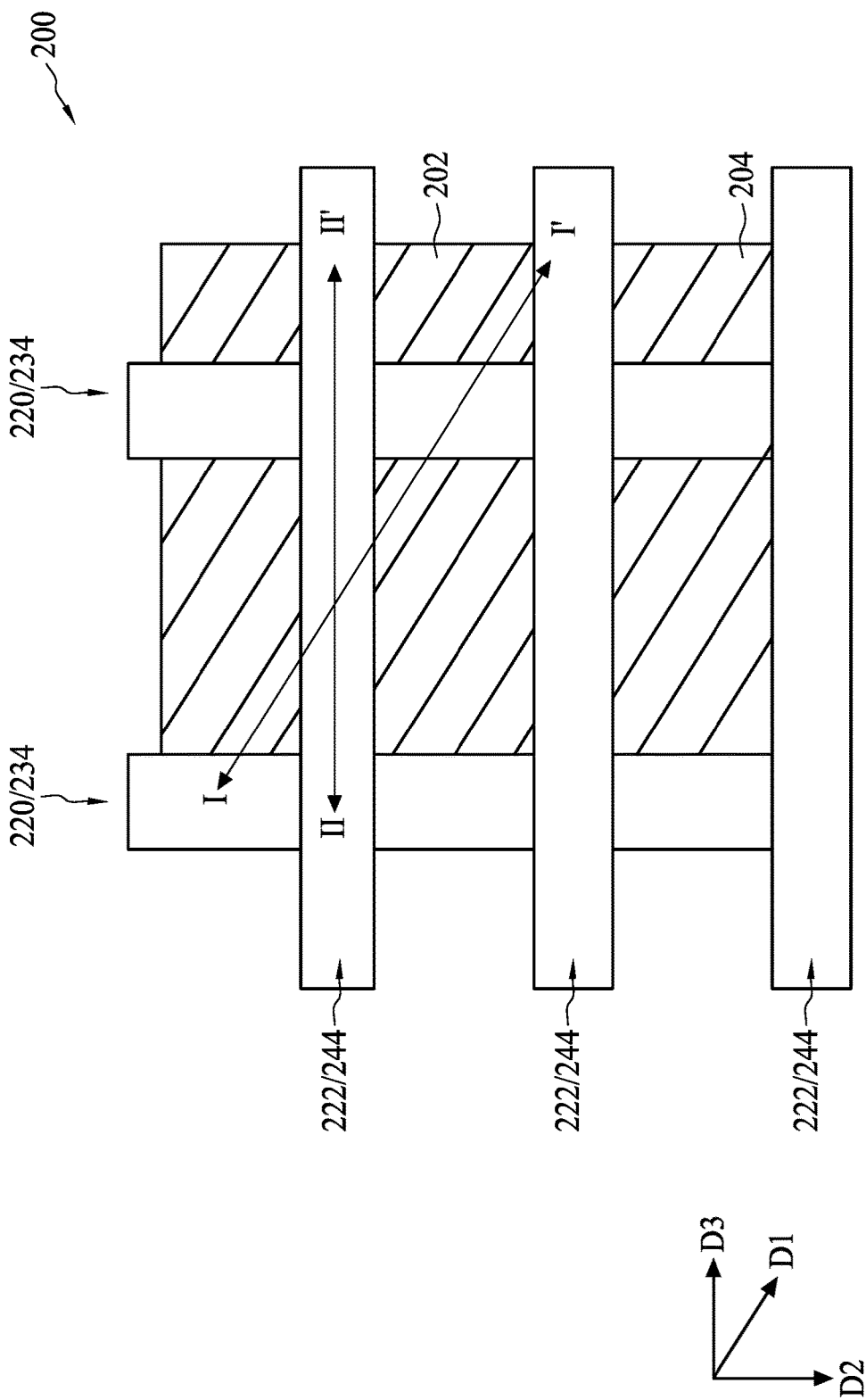
Figure 10C:
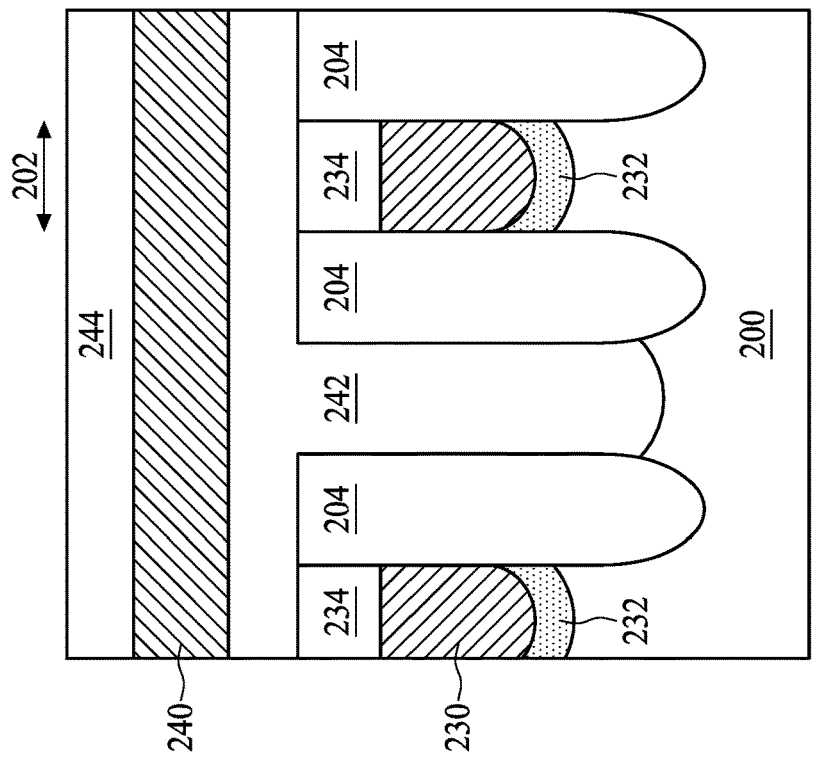
Figure 10B:
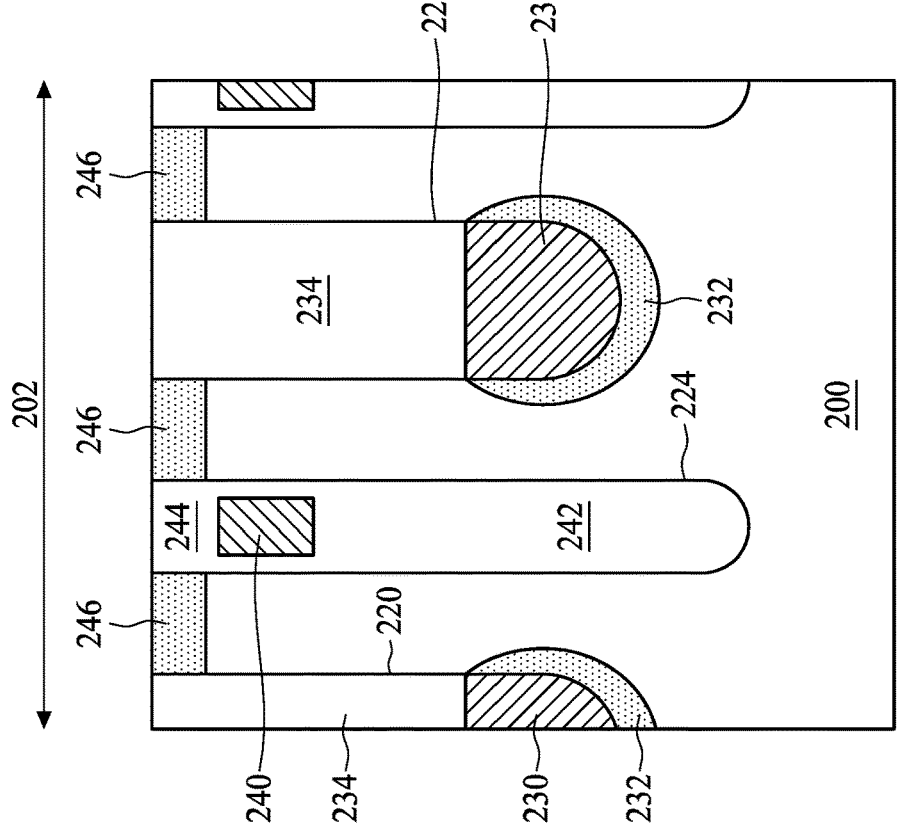

Referring to FIGS. 10A and 10B, next, a plurality of second insulating layers 244 are formed on the buried word lines 240 in the third trenches 224. In some embodiments, the second insulating layers 244 are formed to fill the third trenches 224 and the second trenches 222. In some embodiments, the first insulating layers 242, the dielectric layers, and the second insulating layers 244 together serve as an isolation structure 248 in each third trench 224. Further, the buried word lines 240 are spaced apart and electrically isolated from the substrate 200 by the isolation structures. After forming the isolation structures 248 including the first insulating layers 242, the dielectric layers and the second insulating layers 244, a plurality of second doped regions 246 can be formed in the substrate 200 in the active regions 202. Further, the second doped regions 246 are formed in the substrate 200 between the first trenches 220 and the third trenches 224, as shown in FIG. 10B. In some embodiments, bottom surfaces of the second doped regions 246 are at a level substantially the same as or higher than the top surfaces of the buried word lines 240.

Figure 11A:
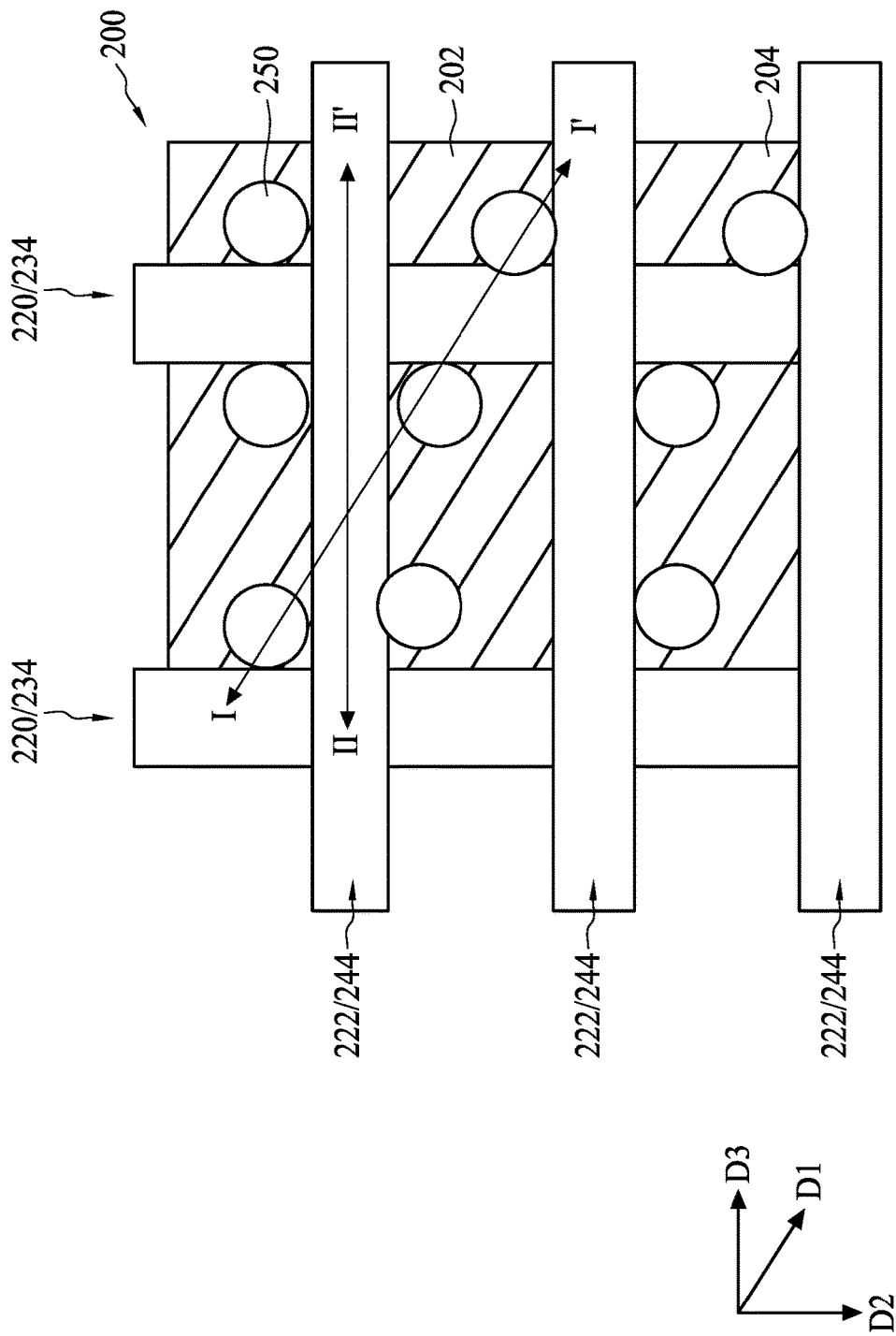
Figure 11B:
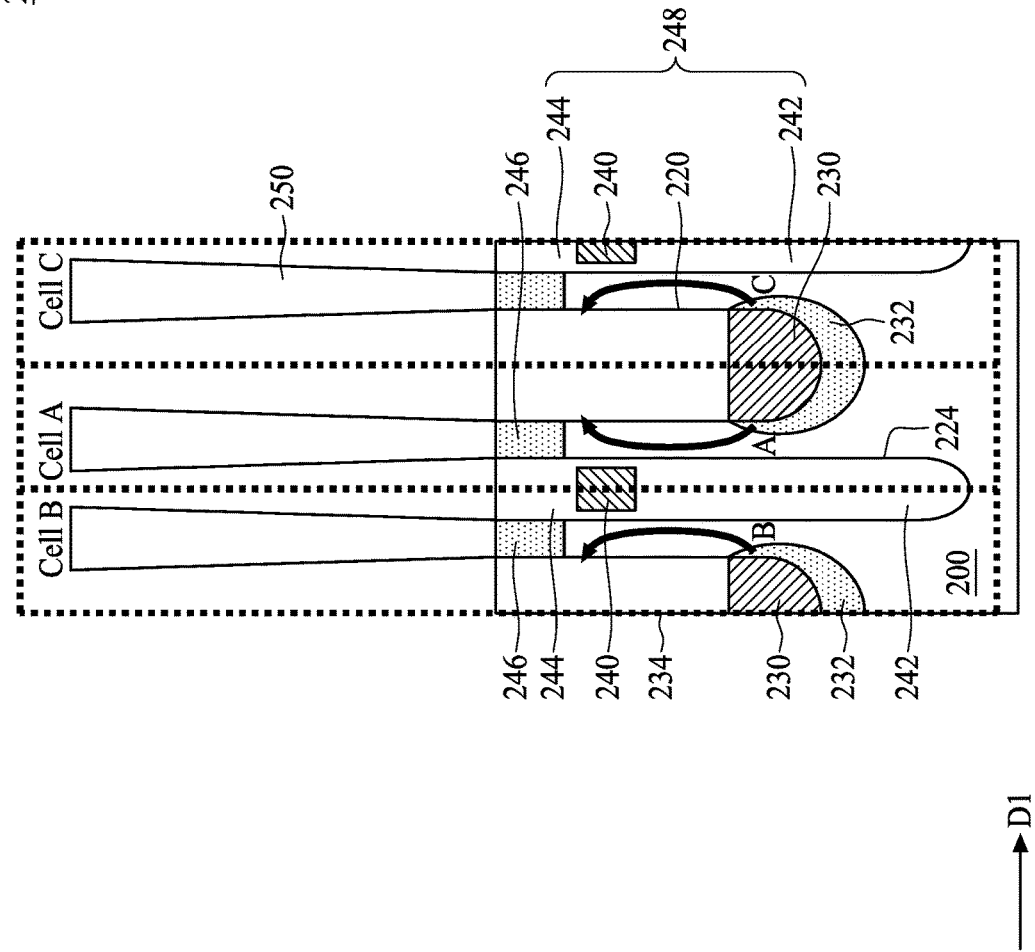

Referring to FIGS. 11A and 11B, next, a plurality of capacitors 250 are formed over the substrate 200 in the active regions 202. Further, the capacitors 250 are individually electrically connected to the second doped regions 246. Accordingly, the semiconductor memory structure 20 is constructed.

As shown in FIGS. 11A and 11B, the semiconductor memory structure 20 includes the substrate 200, the plurality of first trenches 220 in the substrate 200, the plurality of third trenches 224 in the substrate 200, the plurality of buried digit lines 230 disposed in the first trenches 220, and the plurality of buried word lines 240 disposed in the third trenches 224. As shown in FIG. 11B, the first trenches 220 are spaced apart from the third trenches 224. Further, the first trenches 220 and the third trenches 224 are alternately arranged but spaced apart from each other, as shown in FIG. 11B. As mentioned above, the first trenches 220 include the depth d1, the third trenches 224 include the depth d3, and the depth d3 is greater than the depth d1. In some embodiments, the semiconductor memory structure 20 further includes the plurality of isolation structures 204 disposed in the substrate 200, and the isolation structures 204 include the depth da. In some embodiments, the active regions 202 are electrically isolated from each other by the isolation structures 204 and the isolation structure 234. In some embodiments, the depth d1 of the first trenches 220 and the depth d3 of the third trenches 224 are less than the depth da of the isolation structures 204. In some embodiments, the top surfaces of the buried word lines 240 are lower than a surface of the substrate 200, as shown in FIG. 11B. In some embodiments, the top surfaces of the buried digit lines 230 are also lower than the bottom surfaces of buried word lines 240, as shown in FIG. 11B.

As mentioned above, the semiconductor memory structure 20 further includes the plurality of isolation structures 234 individually disposed on the buried digit lines 230 in the first trenches 220. The semiconductor memory structure 20 further includes the plurality of isolation structures 248 including the first insulating layers 242, the dielectric layers and the second insulating layers 244 disposed in the third trenches 224. As mentioned above, the buried word lines 240 are spaced apart from the substrate 200 by the isolation structures 248. The semiconductor memory structure 20 further includes the plurality of first doped regions 232 disposed in the substrate 200 under the first trenches 220, and the second doped regions 246 disposed in the substrate 200 between the first trenches 220 and the third trenches 224. As shown in FIG. 11B, each first doped region 232 surrounds a sidewall and a bottom of a buried digit line 230. The semiconductor memory structure 20 further includes the plurality of capacitors 250 individually electrically connected to the second doped regions 246.

Figure 18:
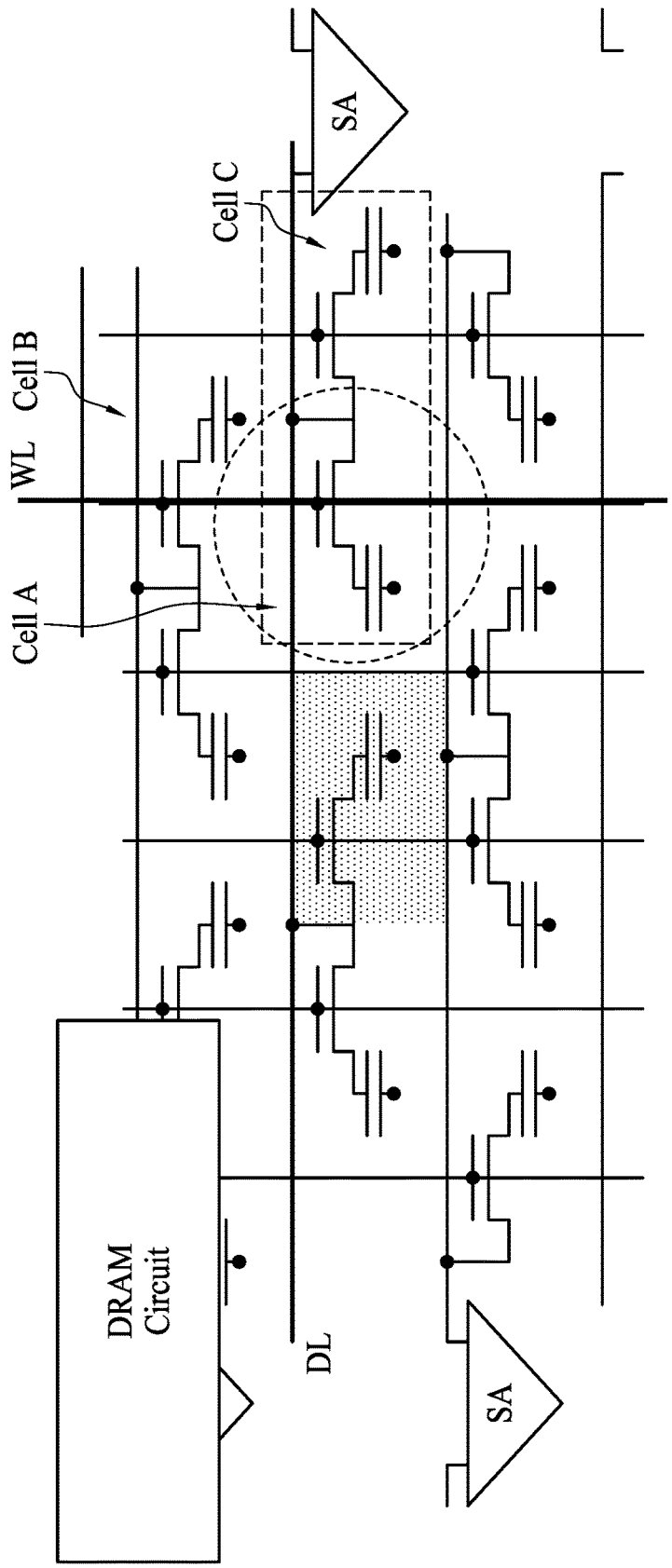
FIG. 18 is a circuit diagram of a semiconductor memory structure.

Referring to FIG. 11B and FIG. 18, in some embodiments, the semiconductor memory structure 20 includes a plurality of memory cells, such as Cell A, Cell B, and Cell C. In some embodiments, a channel region of Cell A extends vertically from the first doped region 232 to the second doped region 246, as depicted by arrow A. In some embodiments, a channel region of Cell B extends vertically from the first doped region 232 to the second doped region 246, as depicted by arrow B. In some embodiments, a channel region of Cell C extends vertically from the first doped region 232 to the second doped region 246, as depicted by arrow C. In some embodiments, Cell A and Cell B share the buried word line 240 therebetween. In some embodiments, Cell A and Cell C share the buried digit line 230 therebetween.

According to the semiconductor memory structure 20, since all the cells include the vertical structure, device density can be increased. Further, the channel regions of different cells are spaced apart from each other by the isolation structures 248 as shown in FIG. 11B, and thus word line disturbance between adjacent pairs of buried word lines 240 is reduced. Further, since the adjacent pairs of buried word lines 240 are spaced apart from each other by the isolation structure 234 therebetween, and the two adjacent pairs of buried digit lines 230 are spaced apart from each other by the isolation structure 248 therebetween, both word line to word line capacitance and digit line to digit line capacitance are reduced. Consequently, performance of the semiconductor memory structure 20 is improved.

FIGS. 12, 13, 14, 15, 16, and 17 are schematic diagrams illustrating various fabrication stages of the method for preparing the semiconductor memory structure in accordance with some embodiments of the present disclosure. It should be noted that similar elements in FIGS. 2A through 17 can include similar materials and can be formed by similar steps; therefore, such details are omitted in the interest of brevity. In some embodiments, step 102 is performed to provide the substrate 200 including the active regions 202. Step 104 is performed to form the first trenches 220 in the substrate 200. Step 106 is performed to form the buried digit lines 230 in the first trenches 220. As mentioned above, the first doped regions 232 and the isolation structures 234 can be formed in step 106. Step 108 is then performed to form the second trenches 222 in the substrate 200. Step 110 is then performed to deepen portions of the second trenches 222 to form the third trenches 224. Step 112 is then performed to form the buried word lines 240' in the third trenches 224. In some embodiments, step 112 for forming the buried word lines 240' further includes following the steps.

Figure 12:
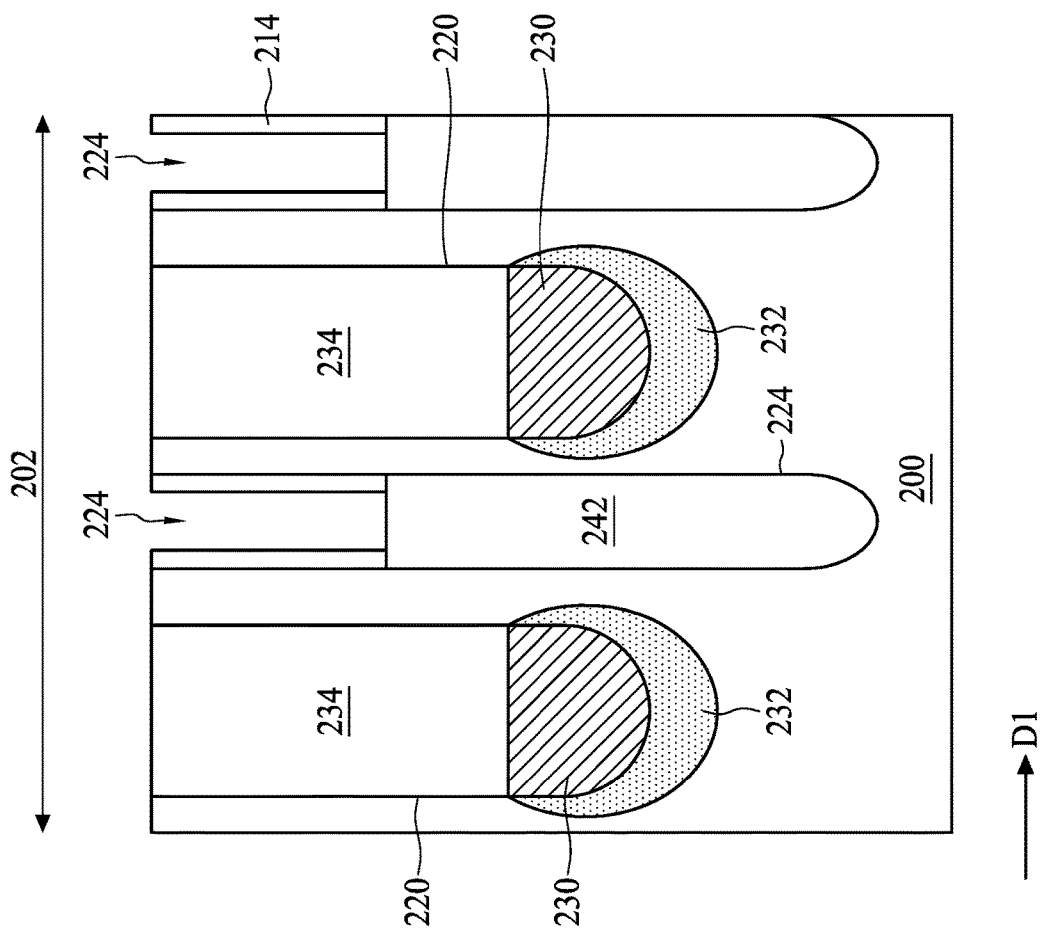
FIGS. 12, 13, 14, 15, 16 and 17 are schematic diagrams illustrating various fabrication stages of the method for preparing the semiconductor memory structure in accordance with some embodiments of the present disclosure.

Referring to FIG. 12, the first insulating layers 242 are formed individually in the third trenches 224. As mentioned above, top surfaces of the first insulating layers 242 are lower than openings of the third trenches 224 but higher than the top surfaces of the buried digit lines 230. Next, a plurality of protecting spacers 214 are formed on the first insulating layers 242 in the third trenches 224. As shown in FIG. 12, the protecting spacers 214 cover a portion of sidewalls of the third trenches 224. In some embodiments, the protecting spacers 214 include material different from the first insulating layers 242 and the substrate 200.

Figure 13:
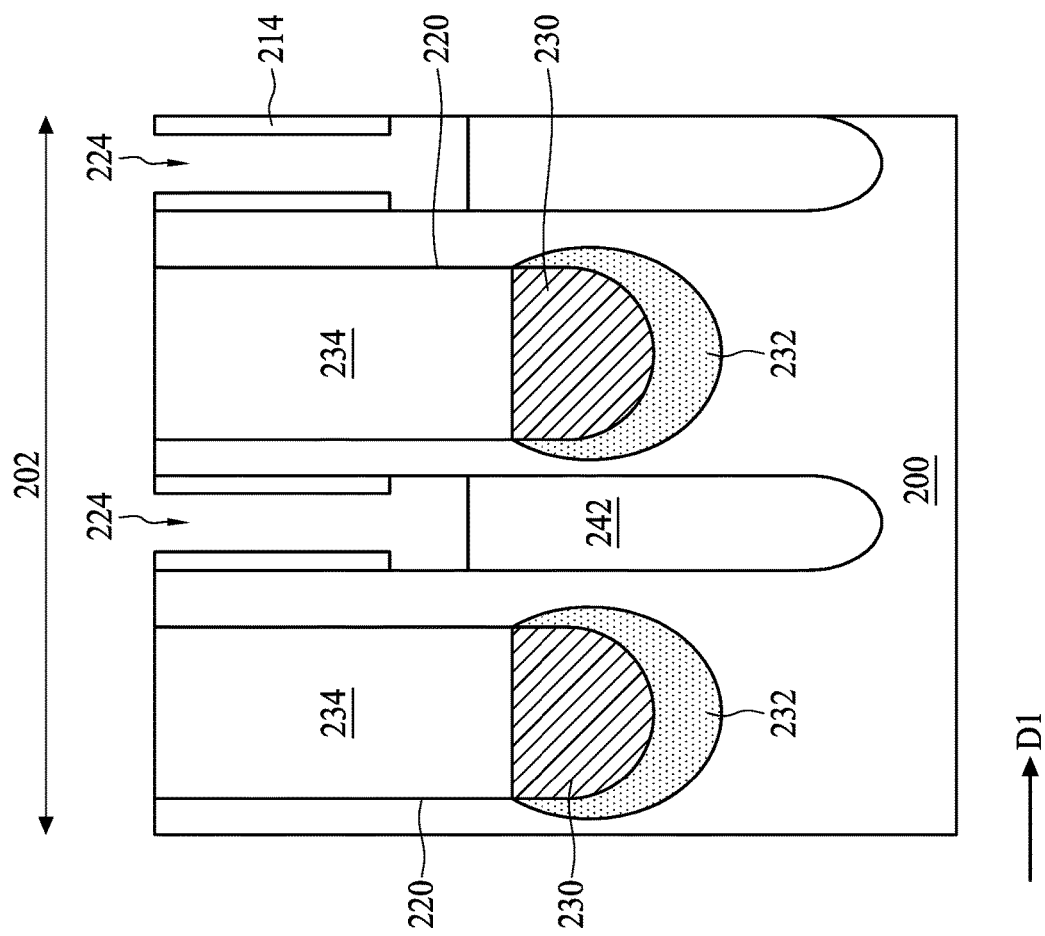

Referring to FIG. 13, next, a portion of the first insulating layers 242 is removed. Consequently, portions of the substrate 200 are exposed from the sidewalls of the third trenches 224, as shown in FIG. 13.

Figure 14:
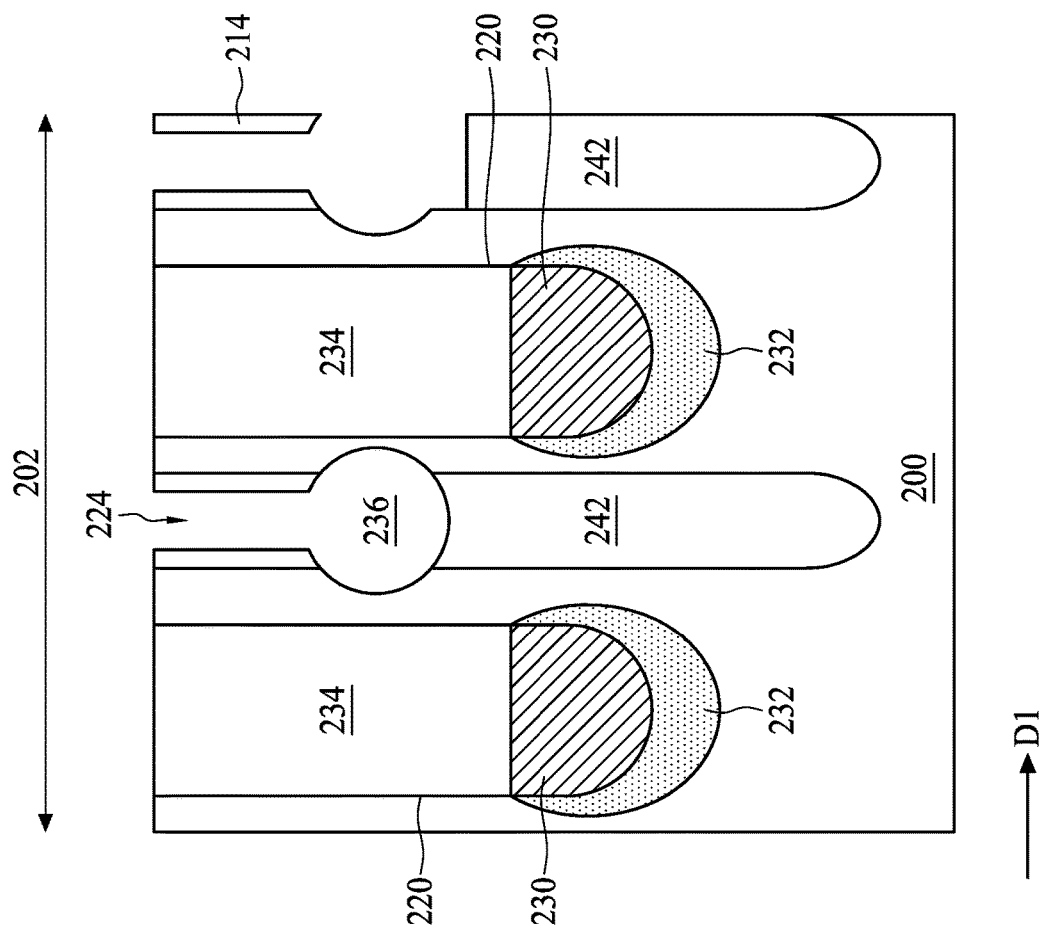

Referring to FIG. 14, the portions of the substrate 200 exposed from the sidewalls of the third trenches 224 are removed, and thus a plurality of curved recesses 236 are formed in the third trenches 224.

Figure 15:
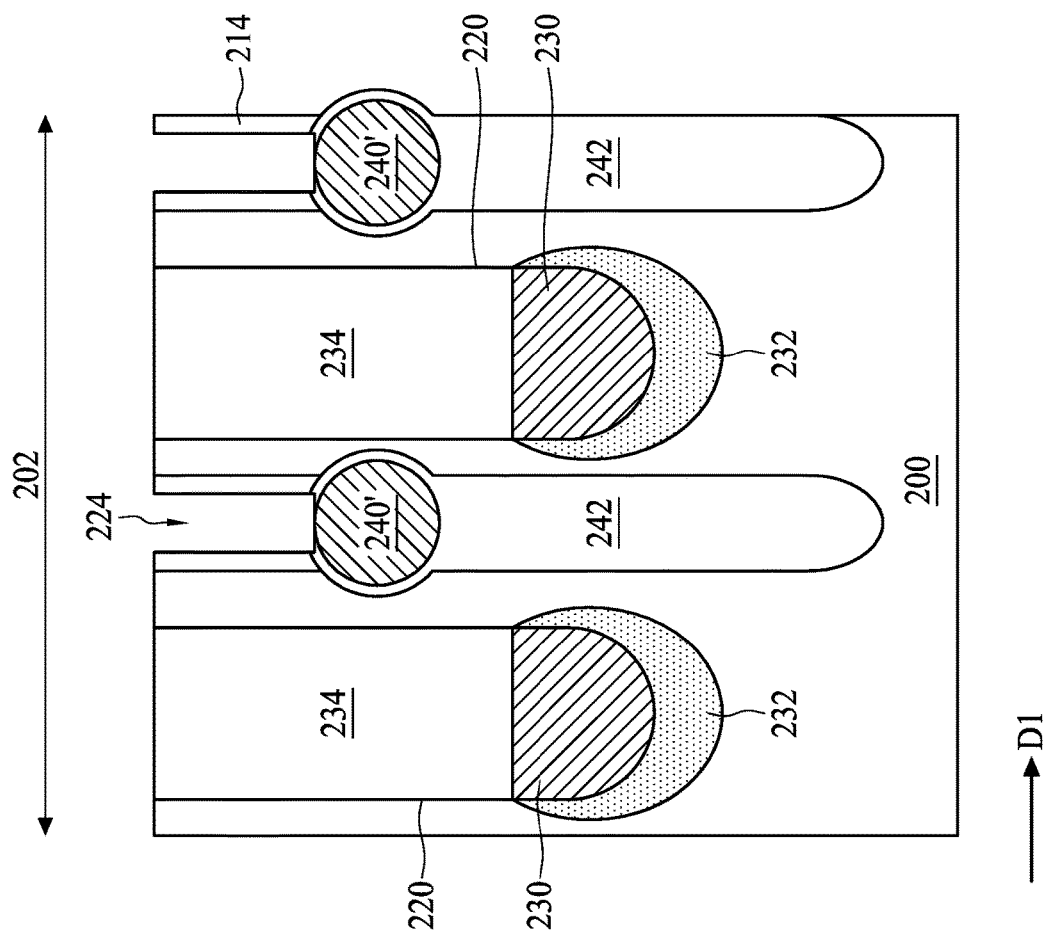

Referring to FIG. 15, a plurality of dielectric layers are individually formed to cover sidewalls of the curved recesses 236. Next, a second conductive material is formed in the curved recesses 236. After the second conductive material is formed, an etching process may be performed to recess the second conductive material. Accordingly, the buried word lines 240' are formed individually on the first insulating layers 242 in the curved recesses 236 in the third trenches 224. In some embodiments, top surfaces of the buried word lines 240' are lower than the openings of the third trenches 224. Further, bottom surfaces of the buried word lines 240' are higher than the top surfaces of the buried digit lines 230, as shown in FIG. 15.

Figure 16:
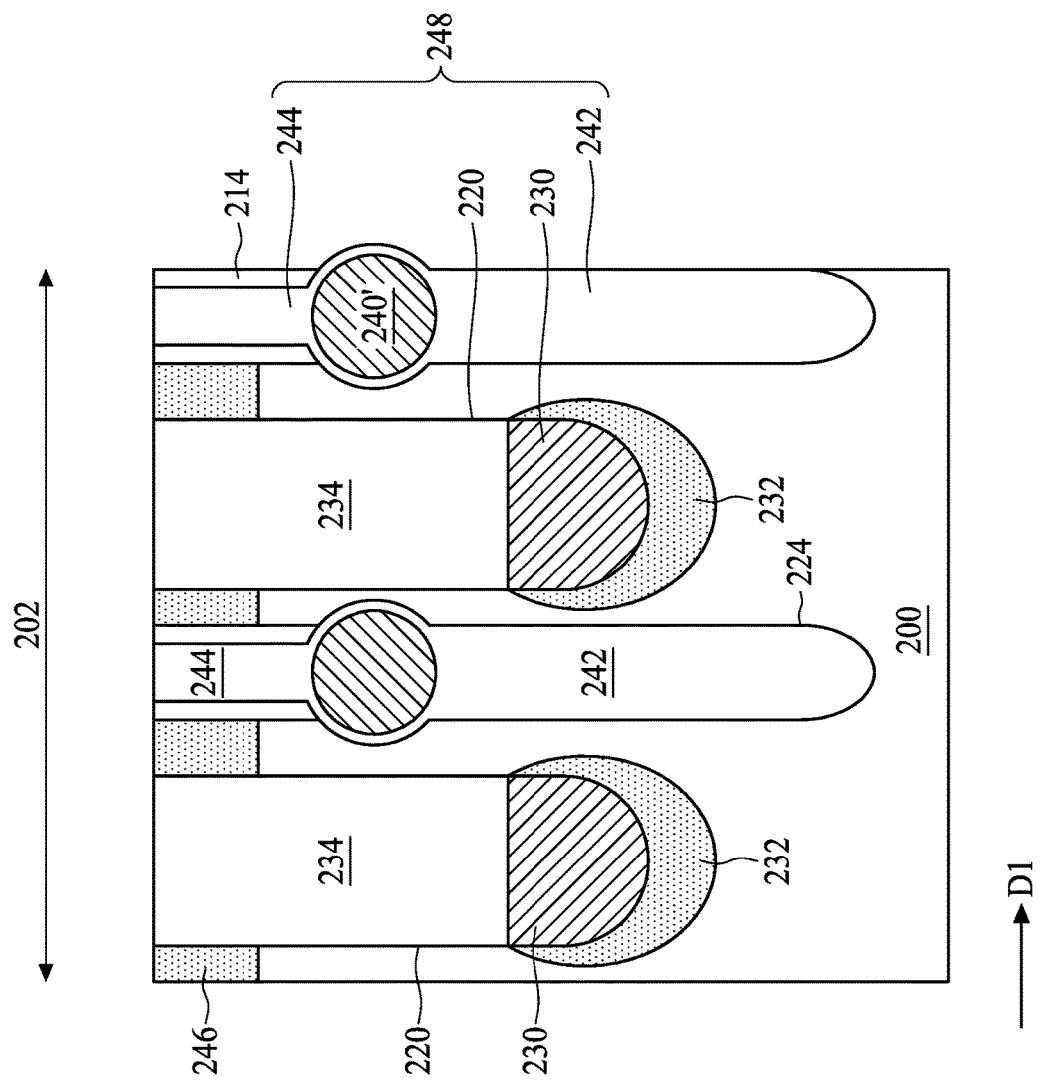

Referring to FIG. 16, a plurality of second insulating layers 244 are formed on the buried word lines 240'. In some embodiments, the second insulating layers are formed to fill the third trenches 224 and the second trenches 222. In some embodiments, the first insulating layers 242, the dielectric layers, and the second insulating layers 244 serve as a plurality of isolation structures 248. After forming the second insulating layer 244, a plurality of second doped regions 246 can be formed in the substrate 200 in the active regions 202. Further, the second doped regions 246 are formed in the substrate 200 between the first trenches 220 and the third trenches 224, as shown in FIG. 16. In some embodiments, bottom surface of the second doped regions 246 are at a level substantially the same as or higher than the top surfaces of the buried word lines 240'.

Figure 17:
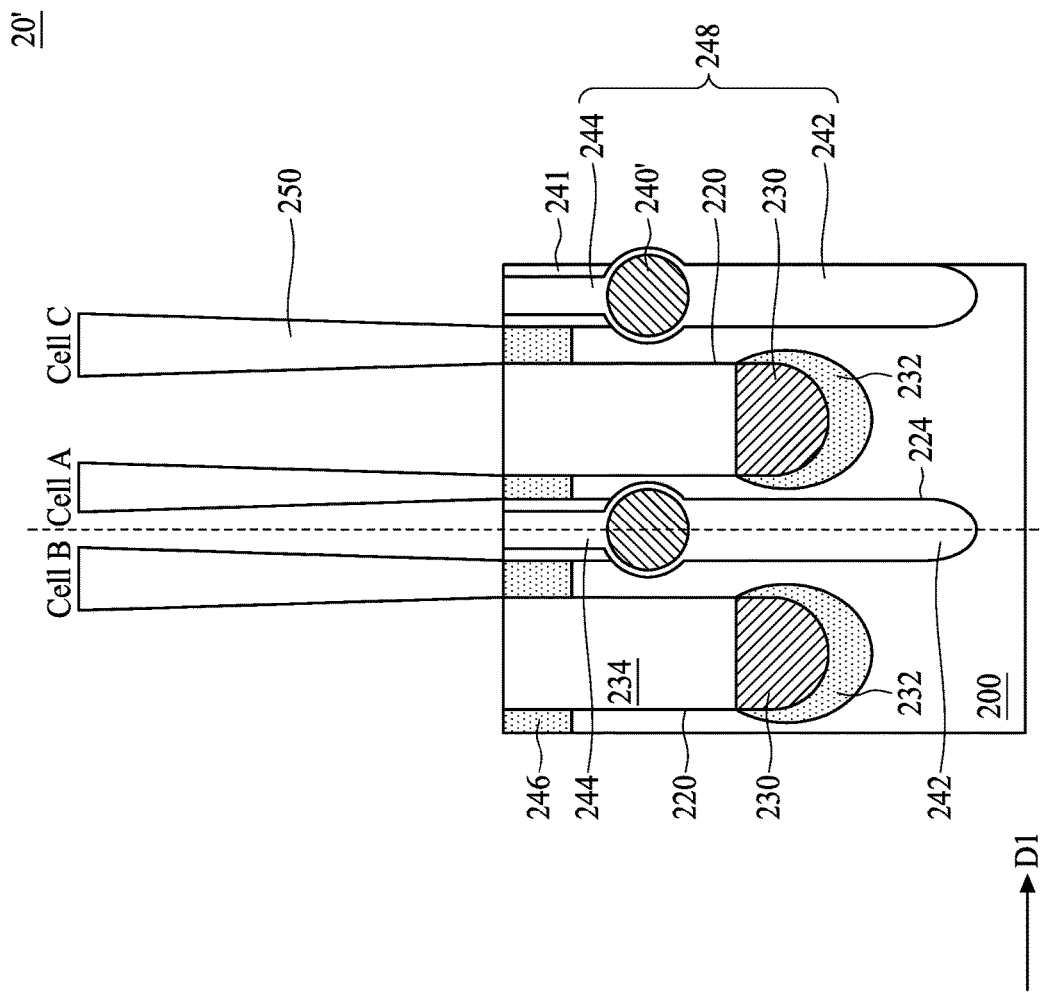

Referring to FIG. 17, next, a plurality of capacitors 250 are formed over the substrate 200 in the active regions 202. Further, the capacitors 250 are individually electrically connected to the second doped regions 246. Accordingly, the semiconductor memory structure 20' is constructed. In the interest of brevity, only the differences between the semiconductor memory structure 20 and the semiconductor memory structure 20' are discussed: in some embodiments, each of the buried word lines 240' includes a curved surface curving toward the first trenches 220, as shown in FIG. 17. In other words, the buried word lines 240' include the curved surfaces curving toward the isolation structures 234 disposed in the first trenches 220. Accordingly, narrower channel regions are to be formed during operation, and thus gate control ability is improved and full depletion is more easily achieved. Further, since the buried word lines 240' include the curved surface, channel width is increased and thus drain-to-source currents $I_{ds}$ is increased.

In the present disclosure, a method for preparing the semiconductor memory structure 10 is provided. By using the two etching processes, adjacent pairs of buried digit lines 230 are spaced apart from each other by the isolation structures 248. By forming the buried word lines 240 having the bottom surfaces higher than the top surfaces of the buried digit lines 230, adjacent pairs of buried word lines 240 are spaced apart from each other by the isolation structures 234 over the buried digit lines 230. Consequently, both word line to word line capacitance and digit line to digit line capacitance are reduced. Further, a semiconductor memory structure 20 including a plurality of buried word lines 240 and a plurality of buried digit lines 230 is provided. Since both of the word lines and digit lines are buried in the substrate, the semiconductor memory structure 20 provides vertical structures, which help to increase device density. Further, the buried word lines 240 and the buried digit lines 230 are alternately arranged. Since adjacent pairs of buried word lines 240 are spaced apart from each other by the isolation structures 234, channel regions are also spaced apart from each other by the isolation structures 234, and thus word line disturbance is reduced.

In contrast, with a comparative DRAM memory structure, two word lines that share the same digit line also share the same channel region, and thus always suffer from word line disturbance.

One aspect of the present disclosure provides a semiconductor memory structure. The semiconductor memory structure includes a substrate, a plurality of first trenches disposed in the substrate, a plurality of second trenches disposed in the substrate and spaced apart from the first trenches, a plurality of buried digit lines disposed in the first trenches, and a plurality of buried word lines disposed in the second trenches. The first trenches include a first depth, and the second trenches include a second depth. In some embodiments, the second depth of the second trenches is greater than the first depth of the first trenches. In some embodiments, top surfaces of the buried word lines are lower than bottom surfaces of the buried digit lines.

Another aspect of the present disclosure provides a method for preparing a semiconductor memory structure. The method includes the following steps. A substrate including a plurality of active regions extending in a first direction is provided. A plurality of first trenches are formed in the substrate. The first trenches include a first depth. In some embodiments, the first trenches extend in a second direction different from the first direction. A plurality of buried digit lines are formed in the first trenches. A plurality of second trenches are formed in the substrate. The second trenches include a second depth. In some embodiments, the second trenches extend in a third direction different from the first direction and the second direction. Portions of the second trenches are deepened to form a plurality of third trenches in the substrate. The third trenches include a third depth. A plurality of buried word lines are formed in the third trenches.

Although the present disclosure and its advantages have been described in detail, it should be understood that various changes, substitutions and alterations can be made herein without departing from the spirit and scope of the disclosure as defined by the appended claims. For example, many of the processes discussed above can be implemented in different methodologies and replaced by other processes, or a combination thereof.

Moreover, the scope of the present application is not intended to be limited to the particular embodiments of the process, machine, manufacture, and composition of matter, means, methods and steps described in the specification. As one of ordinary skill in the art will readily appreciate from the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, is manufacture, compositions of matter, means, methods, or steps.

What is claimed is:

1. A method for preparing a semiconductor memory structure, comprising:
providing a substrate comprising a plurality of active regions and a plurality of first isolation structures extending in a first direction, wherein the plurality of active regions are electrically isolated and spaced apart from each other by the plurality of first isolation structures;
forming a plurality of first trenches in the substrate, the plurality of first trenches comprising a first depth and extending in a second direction different from the first direction;
forming a plurality of buried digit lines in the plurality of first trenches;
forming a plurality of second trenches in the substrate, the plurality of second trenches comprising a second depth and extending in a third direction different from the first direction and the second direction;
deepening portions of the plurality of second trenches to form a plurality of third trenches in the substrate, the plurality of third trenches comprising a third depth; and forming a plurality of buried word lines in the plurality of third trenches;
wherein the first depth of the plurality of first trenches, the second depth of the plurality of second trenches and the third depth of the plurality of third trenches are less than a depth of the plurality of first isolation structures.

2. The method of claim 1, wherein the forming the plurality of buried digit lines further comprises:
forming a plurality of first doped regions in the substrate individually under the plurality of first trenches;
forming the plurality of buried digit lines in the plurality of first trenches, wherein top surfaces of the plurality of buried digit lines are lower than openings of the plurality of first trenches; and
forming a plurality of second isolation structures on the plurality of buried digit lines and filling the plurality of first trenches.

3. The method of claim 1, wherein the forming the plurality of buried word lines further comprises:
forming a plurality of first insulating layers individually in the plurality of third trenches,
wherein top surfaces of the plurality of first insulating layers are lower than openings of the plurality of third trenches and higher than top surfaces of the plurality of buried digit lines;
forming the plurality of buried word lines on the plurality of first insulating layers in the plurality of third trenches, wherein top surfaces of the plurality of buried word lines are lower than the openings of the plurality of third trenches; and
forming a plurality of second insulating layers on the plurality of buried word lines and filling the plurality of third trenches.

4. The method of claim 3, further comprising:
forming a plurality of protecting spacers on the plurality of first insulating layers in the plurality of third trenches;
removing a portion of the plurality of first insulating layers and a portion of the substrate to form a plurality of curved recesses in the plurality of third trenches; and
forming the plurality of buried word lines in the curved recesses in the plurality of third trenches.

5. The method of claim 1, further comprising forming a plurality of second doped regions in the plurality of active regions between the plurality of first trenches and the plurality of third trenches.

6. The method of claim 5, further comprising a plurality of capacitors electrically connected to the plurality of second doped regions on the substrate.

7. The method of claim 1, wherein the third depth of the plurality of third trenches is greater than the first depth of the plurality of first trenches, and the first depth of the plurality of first trenches is greater than the second depth of the plurality of second trenches.

* * * * *